United States Patent
Mikawa et al.

(10) Patent No.: US 8,537,605 B2
(45) Date of Patent: Sep. 17, 2013

(54) NONVOLATILE SEMICONDUCTOR MEMORY DEVICE HAVING COPLANAR SURFACES AT RESISTANCE VARIABLE LAYER AND WIRING LAYER AND MANUFACTURING METHOD THEREOF

(75) Inventors: Takumi Mikawa, Shiga (JP); Yoshio Kawashima, Osaka (JP); Koji Arita, Osaka (JP); Takeki Ninomiya, Osaka (JP)

(73) Assignee: Panasonic Corporation, Osaka (JP)

( * ) Notice: Subject to any disclaimer, the term of this patent is extended or adjusted under 35 U.S.C. 154(b) by 67 days.

(21) Appl. No.: 12/867,437

(22) PCT Filed: Feb. 9, 2009

(86) PCT No.: PCT/JP2009/000501
§ 371 (c)(1),
(2), (4) Date: Aug. 12, 2010

(87) PCT Pub. No.: WO2009/101785
PCT Pub. Date: Aug. 20, 2009

(65) Prior Publication Data
US 2011/0114912 A1    May 19, 2011

(30) Foreign Application Priority Data
Feb. 12, 2008    (JP) .................................. 2008-030242

(51) Int. Cl.
*G11C 11/14*    (2006.01)
(52) U.S. Cl.
USPC .................................. 365/161; 257/E29.002
(58) Field of Classification Search
USPC .................................. 365/161; 257/E29.002
See application file for complete search history.

(56) References Cited

U.S. PATENT DOCUMENTS

| 2001/0027167 A1 | 10/2001 | Kawakubo et al. |
| 2002/0045311 A1 | 4/2002 | Mikawa |

(Continued)

FOREIGN PATENT DOCUMENTS

| CN | 1505043 | 6/2004 |
| JP | 2001-270795 | 10/2001 |

(Continued)

OTHER PUBLICATIONS

Extended European Search Report, issued in European Patent Application No. EP 09 710 369.1, dated Jul. 7, 2011.

(Continued)

*Primary Examiner* — Long Pham
*Assistant Examiner* — Steven Rao
(74) *Attorney, Agent, or Firm* — McDermott Will & Emery LLP

(57) ABSTRACT

A nonvolatile semiconductor memory device (100) comprises a substrate (102) provided with a transistor (101); a first interlayer insulating layer (103) formed over the substrate to cover the transistor; a first contact plug (104) formed in the first interlayer insulating layer and electrically connected to either of a drain electrode (101a) or a source electrode (101b) of the transistor, and a second contact plug (105) formed in the first interlayer insulating layer and electrically connected to the other of the drain electrode or the source electrode of the transistor; a resistance variable layer (106) formed to cover a portion of the first contact plug; a first wire (107) formed on the resistance variable layer; and a second wire (108) formed to cover a portion of the second contact plug; an end surface of the resistance variable layer being coplanar with an end surface of the first wire.

12 Claims, 27 Drawing Sheets

(56) References Cited

U.S. PATENT DOCUMENTS

| | | |
|---|---|---|
| 2004/0051094 A1 | 3/2004 | Ooishi |
| 2004/0114428 A1 | 6/2004 | Morikawa |
| 2005/0041505 A1 | 2/2005 | Mikawa |
| 2005/0118734 A1 | 6/2005 | Mikawa |
| 2005/0242383 A1 | 11/2005 | Mikawa |
| 2006/0118913 A1 | 6/2006 | Yi et al. |
| 2006/0215445 A1 | 9/2006 | Baek et al. |
| 2006/0273429 A1 | 12/2006 | Sakamoto et al. |
| 2006/0273877 A1 | 12/2006 | Kanno et al. |
| 2007/0072310 A1 | 3/2007 | Kumura et al. |
| 2007/0103963 A1 | 5/2007 | Kim et al. |
| 2007/0158634 A1 | 7/2007 | Ooishi |
| 2007/0165452 A1 | 7/2007 | Hayakawa |
| 2007/0206408 A1 | 9/2007 | Schwerin et al. |
| 2007/0217254 A1 | 9/2007 | Matsuoka et al. |
| 2007/0240995 A1 | 10/2007 | Odagawa et al. |
| 2007/0246832 A1 | 10/2007 | Odagawa et al. |
| 2008/0048164 A1* | 2/2008 | Odagawa .......................... 257/2 |
| 2010/0044666 A1 | 2/2010 | Baek et al. |

FOREIGN PATENT DOCUMENTS

| | | |
|---|---|---|
| JP | 2005-120421 | 5/2005 |
| JP | 2006-120701 | 5/2006 |
| JP | 2006-270116 | 10/2006 |
| JP | 2006-279042 | 10/2006 |
| JP | 2006-294970 | 10/2006 |
| JP | 2007-095898 | 4/2007 |
| JP | 2007-194238 | 8/2007 |
| JP | 2007-273962 | 10/2007 |
| JP | 2007-287761 | 11/2007 |
| JP | 2007-288008 | 11/2007 |
| JP | 2007-294998 | 11/2007 |
| JP | 2008-021750 | 1/2008 |
| WO | WO 2007/102341 A1 | 9/2007 |
| WO | WO 2007/138646 A1 | 12/2007 |
| WO | WO-2008/078197 A2 | 7/2008 |
| WO | WO 2008/149605 A1 | 12/2008 |

OTHER PUBLICATIONS

Extended European Search Report issued in European Patent Application No. 12152973.9 mailed Jan. 9, 2013.

Chinese Office Action issued in Chinese Patent Application No. CN 200980104930.9 dated May 8, 2013. (No English Translation provided by Applicants').

Japanese Office Action issued in Japanese Patent Application No. 2010-171014 mailed on Jul. 23, 2013.

* cited by examiner (a)

(b)

(a)

(b)

(c)

(a)

(b)

(a)

(b)

(c)

(a)

(b)

(c)

(a)

(b)

(a)

(b)

(a)

(b)

(a)

(b)

NONVOLATILE SEMICONDUCTOR MEMORY DEVICE HAVING COPLANAR SURFACES AT RESISTANCE VARIABLE LAYER AND WIRING LAYER AND MANUFACTURING METHOD THEREOF

RELATED APPLICATIONS

This application is the U.S. National Phase under 35 U.S.C. §371 of International Application No. PCT/JP2009/000501, filed on Feb. 9, 2009, which in turn claims the benefit of Japanese Application No. 2008-030242, filed on Feb. 12, 2008, the disclosures of which Applications are incorporated by reference herein.

TECHNICAL FIELD

The present invention relates to a nonvolatile semiconductor memory device configured to change resistance values to be retained stably, in response to voltage pulses applied, and a manufacturing method thereof.

BACKGROUND ART

With recent advancement of digital technologies, electronic hardware such as portable information apparatuses and home information appliances have been developed to provide higher functionality. For this reason, there have been increasing demands for a larger capacity of nonvolatile memory elements, reduction in a write electric power in the memory elements, reduction in write/read time in the memory elements, and longer life of the memory elements.

Under the circumstances in which there are such demands, miniaturization of the existing flash memory using a floating gate has been progressing. In addition to this, a nonvolatile semiconductor memory element (resistance variable memory) including as a memory section a resistance variable element which changes resistance values to be retained stably, in response to voltage pulses applied, is expected to achieve further miniaturization, higher speed, and lower electric power consumption, because a memory cell is allowed to have a simple structure.

Therefore, conventionally, memory cells are each configured to include one transistor and one memory element and perform a stable memory operation, and are highly integrated.

For example, there is disclosed so-called 1T1R-type memory cells each including one transistor and one resistance variable element as a memory cell, in which the resistance variable element includes a resistance variable layer which is located immediately below an upper electrode and comprises a perovskite structure material such that the resistance variable layer has a resistance changing region in a part thereof (see for example patent document 1). The resistance variable element has a structure in which a portion of the lower electrode which contacts a portion of the resistance variable layer is different in area from a portion of the upper electrode which contacts a portion of the resistance variable layer, and the resistance changing region is located immediately on the lower electrode with a smaller area. Therefore, resistance change is allowed to surely occur in a region in the vicinity of the electrode connected to the resistance variable layer with a smaller area, by applying voltages lower than those conventionally used, which enables achievement of miniaturization and reduction of electric power consumption.

An exemplary configuration of 1T1C-type memory cells each including one transistor and one ferroelectric capacitor has been proposed, in which a part of a capacitive insulating layer and a part of upper electrodes do not suffer from damage which would be caused by, for example, exposure to hydrogen gas and the like, during other process steps after manufacturing process steps for forming the capacitive insulating layer comprising ferroelectric capacitors immediately below the upper electrodes (for example, see patent document 2).

An exemplary configuration of 1T1C-type memory cells each including one transistor and one ferroelectric capacitor has been proposed, in which a charging damage to the ferroelectric capacitors can be avoided, because the memory cells have a wire structure in which wires electrically connected to the ferroelectric capacitors are formed by processing a wire material after stacking the wire material on the ferroelectric capacitors (for example, see patent document 3).

Patent document 1: Japanese Laid-Open Patent Application Publication No. 2006-120701
Patent document 2: Japanese Laid-Open Patent Application Publication No. 2006-270116
Patent document 3: Japanese Laid-Open Patent Application Publication No. 2007-95898

DISCLOSURE OF THE INVENTION

Problems to be Solved by the Invention

However, in the above explained prior arts, it is difficult to form and process the memory elements such as the resistance variable elements, and, satisfactory miniaturization is not achieved.

FIG. 15 is a cross-sectional view of a general conventional nonvolatile semiconductor memory device 10. As shown in FIG. 15, a resistance variable element 1 has three layers which are a lower electrode 2, a resistance variable layer 3 and an upper electrode 4, and is connected to a transistor 5 via a first contact plug 6. A 1T1R-type memory cell 7 includes the resistance variable element 1 and the transistor 5 and is connected to a first wire 11 via a third contact plug 9, and to a second wire 12 via a second contact plug 8, respectively, thereby allowing the memory cell 7 to be driven by a peripheral circuit.

In general, the memory cell 7 including the resistance variable element 1 is formed to be isolated from their adjacent cells (not shown) using a dot-type isolation pattern. In this case, in a photolithography step, a photoresist pattern is required to ensure adhesiveness with an area of each dot which is isolated from others, and there exists a problem that miniaturization is not achieved as compared to a case where a line pattern shared by adjacent cells is used. In addition, to lead out an electrical potential from the resistance variable element 1, it is necessary to connect a contact to the lower electrode 2 and connect a contact to the upper electrode 4. Therefore, it is necessary to add three masks in total, corresponding to lead-out contacts connected to the lower electrode 2, the resistance variable element 1 and lead-out contacts connected to the upper electrode 4.

To be more specific, in the configuration of FIG. 15, six masks in total are required to form major constituents of the memory cell, which are the first contact plug 6, the resistance variable element 1, the third contact plug 9, a gate electrode, the second contact plug 8, the first wire 11 and the second wire 12, other than masks required to form source and drain regions of the transistor 5.

The present invention has been made to solve the above mentioned problems, and an object of the present invention is to provide a nonvolatile semiconductor memory device including 1T1R-type memory cell including one transistor and one resistance variable element, and having a miniaturized structure, the memory cell including resistance variable element having a simplified structure so that the memory cell is manufactured by merely adding one mask to steps of forming transistor and electric connection plug such as lead-out wire, and a manufacturing method thereof.

Means for Solving the Problems

To achieve the above object, a nonvolatile semiconductor memory device of the present invention comprises a substrate provided with a transistor; a first interlayer insulating layer formed over the substrate to cover the transistor; a first contact plug formed in the first interlayer insulating layer and electrically connected to either a drain electrode or a source electrode of the transistor, and a second contact plug formed in the first interlayer insulating layer and electrically connected to the other of the drain electrode or the source electrode of the transistor; resistance variable layer formed to cover a portion of the first contact plug; a first wire formed on the resistance variable layer; and a second wire formed to cover a portion of the second contact plug; an end surface of the resistance variable layer being coplanar with an end surface of the first wire.

Or, a nonvolatile semiconductor memory device of the present invention comprises a substrate provided with a transistor including a first main electrode, a second main electrode, and a control electrode; a first interlayer insulating layer formed over the substrate to cover the transistor; a first contact plug formed to penetrate the first interlayer insulating layer and to be electrically connected to the first main electrode; resistance variable layer formed to cover a portion of an upper end surface of the first contact plug; and a first wire formed on the resistance variable layer to extend in a first direction; wherein when the first direction is a forward and rearward direction, and a direction which is perpendicular to the first direction and parallel to a main surface of the substrate is a rightward and leftward direction, an end surface of the resistance variable layer in the forward and rearward direction is not coplanar with an end surface of the first wire, a left end surface of the first wire is coplanar with a left end surface of the resistance variable layer, and a right end surface of the first wire is coplanar with a right end surface of the resistance variable layer.

In such a configuration, 1T1R-type memory cell is formed, and the lower electrode of the resistance variable element and the first contact plug are constituted by an identical constituent, while the upper electrode of the resistance variable element and the first wire are constituted by an identical constituent. Thus, a structure of the memory cell is simplified. Since the end surface of the resistance variable layer is coplanar with the end surface of the first wire, the memory cell can be miniaturized without a need for a margin for alignment between different masks used to form the resistance variable layer and the first wire separately. Since the resistance variable layer can be formed by adding one mask to a standard Si semiconductor process, it is possible to implement a nonvolatile semiconductor memory device at a reduced process cost without increasing the number of process steps.

In other words, in such a configuration, four masks in total are sufficient to form the major constituents of the memory cell, which are the first contact plug, the second contact plug, the gate electrode, the resistance variable layer, and the first wire, other than masks required to form source and drain regions of the transistor. The masks are fewer by two than the masks used to form the memory cell of FIG. 15.

The first wire may include an electrode layer comprising a precious metal on a surface thereof contacting the resistance variable layer. The precious metal may be platinum.

In such a configuration, since the electrode layer comprising precious metal such as platinum is joined to the resistance variable layer comprising metal oxide (tantalum oxide) with high adhesiveness, rather than a silicon oxide layer which is low in adhesiveness, the electrode layer will not peel off the resistance variable layer. The electrode layer comprising precious metal based material for enabling resistance changing operation is easily implemented with a structure easily integrated without increasing a cell size.

A nonvolatile semiconductor memory device of the present invention comprises a substrate provided with a transistor; a first interlayer insulating layer formed over the substrate to cover the transistor; a first contact plug formed in the first interlayer insulating layer and electrically connected to either a drain electrode or a source electrode of the transistor, and a second contact plug formed in the first interlayer insulating layer and electrically connected to the other of the drain electrode or the source electrode of the transistors; a first wire formed to cover a portion of the first contact plug; a first resistance variable layer formed on the first wire to have an end surface which is coplanar with an end surface of the first wire; a second wire formed to cover a portion of the second contact plug; a second resistance variable layer formed on the second wire, to have an end surface which is coplanar with an end surface of the second wire; a second interlayer insulating layer formed over the first interlayer insulating layer to cover the first wire, the second wire, the first resistance variable layer and the second resistance variable layer; a third contact plug formed on the first resistance variable layer to penetrate the second interlayer insulating layer; a fourth contact plug formed on the second wire to penetrate the second interlayer insulating layer and the second resistance variable layer; and a third wire and a fourth wire which are formed on the second interlayer insulating layer such that the third wire covers the third contact plugs, and the fourth wire covers the fourth contact plug.

In such a configuration, 1T1R-type memory cell is formed, and the lower electrode of the resistance variable element and the first wire are constituted by an identical constituent, while the upper electrode of the resistance variable element and the third contact plug are constituted by an identical constituent. Thus, a structure of the memory cell is simplified and miniaturized. Since the resistance variable layer can be formed by adding one mask for forming a hole to a standard Si semiconductor process, it is possible to implement a nonvolatile semiconductor memory device at a reduced process cost without increasing the number of process steps. By setting the size of the fourth contact hole larger than the size of the third contact hole, the third contact hole and the fourth contact hole can be formed concurrently, by making use of a feature of a hole etching that an etching rate is higher as the size is larger. In this case, it is possible to implement a nonvolatile semiconductor memory device at a lower process cost without adding any masks.

A nonvolatile semiconductor memory device of the present invention comprises: a substrate provided with a transistor; a first interlayer insulating layer formed over the substrate to cover the transistor; a first contact plug formed inside a first contact hole in the first interlayer insulating layer and electrically connected to either a drain electrode or a source electrode of the transistor; a second contact plug formed inside a second contact hole in the first interlayer insulating layer and electrically connected to the other of the drain electrode or the source electrode of the transistors; a first wire formed to cover a portion of the first contact plugs; a second wire formed to cover a portion of the second contact plugs; and a resistance variable layer which is formed on a bottom portion and a side wall inside the first contact hole, such that the resistance variable layer is sandwiched between the first contact plug and the first interlayer insulating layer and are electrically connected to the drain electrode or the source electrode.

In such a configuration, 1T1R-type memory cell is formed, and the lower electrode of the resistance variable element and the drain electrode or the source electrode are constituted by an identical constituent, while the upper electrode of the resistance variable element is identical in constituent to the first wire and the first contact plug. Thus, a structure of the memory cell is simplified and miniaturized. Since the bottom portion of the resistance variable layer is not exposed during processes such as CMP or dry etching, plasma damage, damage caused by gases or slurry, influence of reduction, etc. with respect to the resistance variable layer can be surely prevented. Since the resistance variable layer can be formed by adding only one mask to the standard Si semiconductor process, it is possible to implement a nonvolatile semiconductor memory device at a reduced process cost without increasing the number of process steps.

The resistance variable layer may comprise a material including at least tantalum oxide.

In the above configuration, it is possible to implement a nonvolatile semiconductor memory device which has a reversible and stable rewrite characteristic and a good resistance value retention characteristic as well as high-speed operability and can be manufactured in a manufacturing process which is highly compatible with a standard Si semiconductor process.

A method of manufacturing a nonvolatile semiconductor memory device of the present invention comprises the steps of forming a first interlayer insulating layer over a substrate provided with a transistor such that the first interlayer insulating layer covers the transistor; forming a first contact hole on either a drain electrode or a source electrode of the transistor and a second contact hole on the other of the drain electrode or the source electrode of the transistor such that the first contact hole and the second contact hole penetrate the first interlayer insulating layer, and forming a first contact plug into the first contact hole and a second contact plug into the second contact hole;
forming a resistance variable layer such that the resistance variable layer cover a portion of the first contact plug; and removing a portion of the resistance variable layer and forming a first wire and a second wire such that the first wire covers a portion of the resistance variable layer and the second wire covers a portion of the second contact plug.

In such a method, a 1T1R-type memory cell is formed, and the lower electrode of the resistance variable element and the first contact plug are constituted by an identical constituent, while the upper electrode of the resistance variable element and the first wire are constituted by an identical constituent. Thus, a structure of the memory cell is simplified. Since the end surface of the resistance variable layer is coplanar with the end surface of the first wire, the memory cell can be miniaturized without a need for a margin for alignment between different masks used to form the resistance variable layer and the first wire separately.
Since resistance variable layer can be formed by adding only one mask to the standard Si semiconductor process, it is possible to implement a nonvolatile semiconductor memory device at a reduced process cost without increasing the number of process steps.

A method of manufacturing a nonvolatile semiconductor memory device of the present invention comprises the steps of forming a first interlayer insulating layer over a substrate provided with a transistor such that the first interlayer insulating layer covers the transistor; forming a first contact hole on either a drain electrode or a source electrode of the transistor and a second contact hole on the other of the drain electrode or the source electrode of the transistor such that the first contact hole and the second contact hole penetrate the first interlayer insulating layer, and forming first contact plug into the first contact hole and second contact plug into the second contact hole;
forming a first wire layer and a first resistance variable layer such that the first wire layer and the first resistance variable layer cover a portion of the first contact plug and the first resistance variable layer has an end surface coplanar with an end surfaces of the first wire layers, and forming a second wire layer and second resistance variable layer such that the second wire layer and the second resistance variable layer cover a portion of the second contact plug and the second resistance variable layer has an end surface coplanar with an end surface of the second wire layer; forming a second interlayer insulating layer over the first interlayer insulating layer such that the second interlayer insulating layer covers the first wire, the first resistance variable layer, the second wire and the second resistance variable layer; forming a third contact plug on the first resistance variable layer such that the third contact plug penetrate the second interlayer insulating layer; forming a fourth contact plug on the second wire, such that the fourth contact plug penetrate the second interlayer insulating layer and the second resistance variable layer; and forming a third wire and a fourth wire on the second interlayer insulating layer such that the third wire covers the third contact plug and the fourth wire covers the fourth contact plug.

In such a method, a 1T1R-type memory cell is formed, and the lower electrode of the resistance variable element and the first wire are constituted by an identical constituent, while the upper electrode of each of the resistance variable element and the third contact plug are constituted by an identical constituent. Thus, a structure of the memory cell is simplified and miniaturized. Since the resistance variable layer can be formed by adding one mask for forming a hole to a standard Si semiconductor process, it is possible to implement a nonvolatile semiconductor memory device at a reduced process cost without increasing the number of process steps. By setting the size of the fourth contact hole larger than the size of the third contact hole, the third contact hole and the fourth contact hole can be formed concurrently, by making use of a feature of a hole etching that an etching rate is higher as the size is larger. In this case, it is possible to implement a nonvolatile semiconductor memory device at a lower process cost without adding any masks.

A method of manufacturing a nonvolatile semiconductor memory device of the present invention comprises the steps of: forming a first interlayer insulating layer on a substrate provided with a transistor such that the first interlayer insulating layer covers the transistor; forming a first contact hole on either a drain electrode or a source electrode of the transistor such that the first contact hole penetrate the first interlayer insulating layer; forming a resistance variable layer on a bottom portion and a side wall inside the first contact holes; forming a first contact plug inside the resistance variable layer within the first contact holes; forming a second contact hole on the other of the drain electrode or the source electrode of the transistor such that the second contact hole penetrate the first interlayer insulating layer; forming a second contact plug inside the second contact hole; and forming a first wire and a second wire such that the first wire covers a portion of the resistance variable layer and the second wire covers a portion of the second contact plug.

In such a method, a 1T1R-type memory cell is formed, and the lower electrode of the resistance variable element and ether the drain electrode or the source electrode are constituted by an identical constituent, while the upper electrode of each of the resistance variable elements is identical in constituent to the first wire and the first contact plug. Thus, a structure of the memory cell is simplified and miniaturized. Since the bottom portion of the resistance variable layer is not exposed during processes such as CMP or dry etching, plasma damage, damage caused by gases or slurry, influence of reduction, etc. with respect to the resistance variable layer can be surely prevented. Since resistance variable layer can be formed by adding only one mask to the standard Si semiconductor process, it is possible to implement a nonvolatile semiconductor memory device at a reduced process cost without increasing the number of process steps.

The above and further objects, features and advantages of the present invention will more fully be apparent from the following detailed description of preferred embodiments with accompanying drawings.

Advantage of the Invention

In a nonvolatile semiconductor memory device of the present invention, a 1T1R-type memory cell has a simplified structure in which the upper electrode of the resistance variable element and the wire or the contact plug are constituted by an identical constituent and the lower electrode of each of the resistance variable layer and the wire or the contact plug are constituted by an identical constituent, and resistance variable layer can be formed by adding only one mask to a standard Si semiconductor process.

Therefore, the present invention provides a nonvolatile semiconductor memory device which has a reversible and stable rewrite characteristic and a good resistance value retention characteristic as well as high-speed operability. The nonvolatile semiconductor memory device has a great advantage that it can be manufactured in a manufacturing process which is highly compatible with the standard Si semiconductor process at a low cost.

Figure 1A:
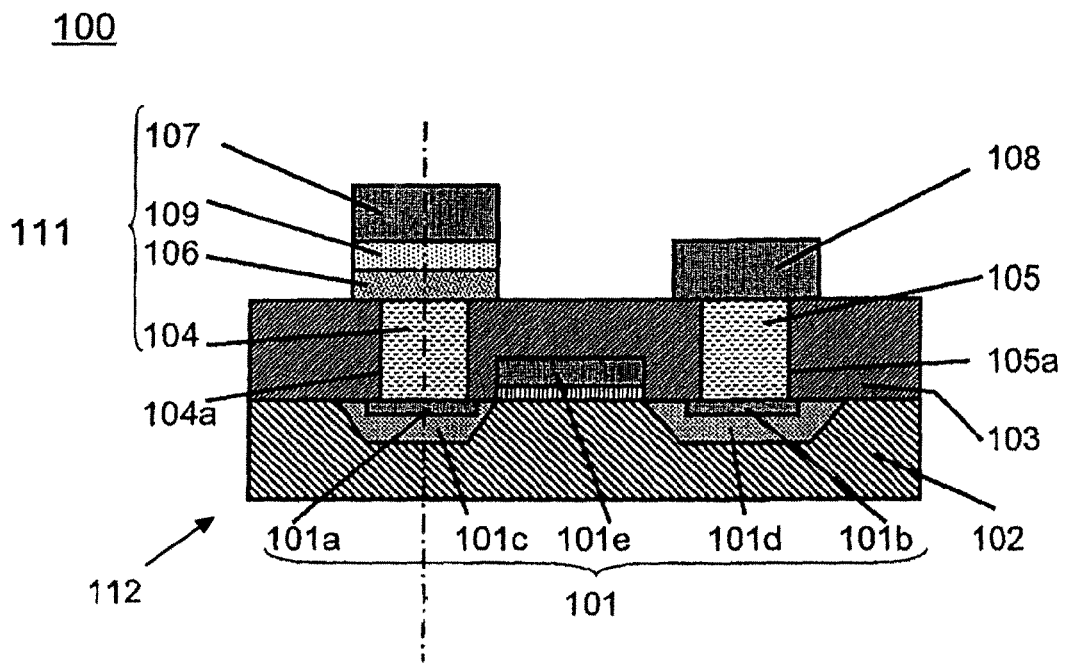
FIG. 1(a) is a cross-sectional view showing an exemplary configuration of a nonvolatile semiconductor memory device according to Embodiment 1 of the present invention.

DESCRIPTION OF THE REFERENCE NUMERALS 100, 200, 300, 400 nonvolatile semiconductor memory devices
101 transistor
101a drain electrode
101b source electrode
101c drain region
101d source region
101e gate electrode
102 substrate
103 first interlayer insulating layer
104, 301, 402, 511 first contact plug
104a, 301a first contact hole
105, 302, 403, 517 second contact plug
105a second contact hole
106, 305, 401, 513 resistance variable layer
106a, 107a, 110 end surfaces
107, 201, 303, 404, 515 first wire
108, 203, 304, 405, 518 second wire
109, 514 electrode layer
111, 210, 306, 406 resistance variable element
112, 211, 307, 407, 516 memory cell
202 first resistance variable layer (resistance variable layer)
204 second resistance variable layer (resistance variable layer)
205 second interlayer insulating layer
206, 519 third contact plug
206a third contact hole
207 fourth contact plug
207a fourth contact hole
208 third wire
209 fourth wire
500 nonvolatile semiconductor device
501 memory main section
502 memory array
503 row select circuit/driver
504 column select circuit
505 write circuit
506 sense amplifier
507 data input/output circuit

BEST MODE FOR CARRYING OUT THE INVENTION

Hereinafter, nonvolatile semiconductor memory devices according to embodiments of the present invention and manufacturing methods thereof will be described with reference to the drawings. Throughout the drawings, the constituents designated by the same reference numerals will not be described repetitively in some cases. In addition, in the drawings, the constituents are schematically depicted for easier understanding. Therefore, the shapes and the like of the constituents are not depicted correctly.

Embodiment 1

FIG. 1(a) is a cross-sectional view showing an exemplary configuration of a nonvolatile semiconductor memory device 100 according to Embodiment 1 of the present invention.

Figure 1B:
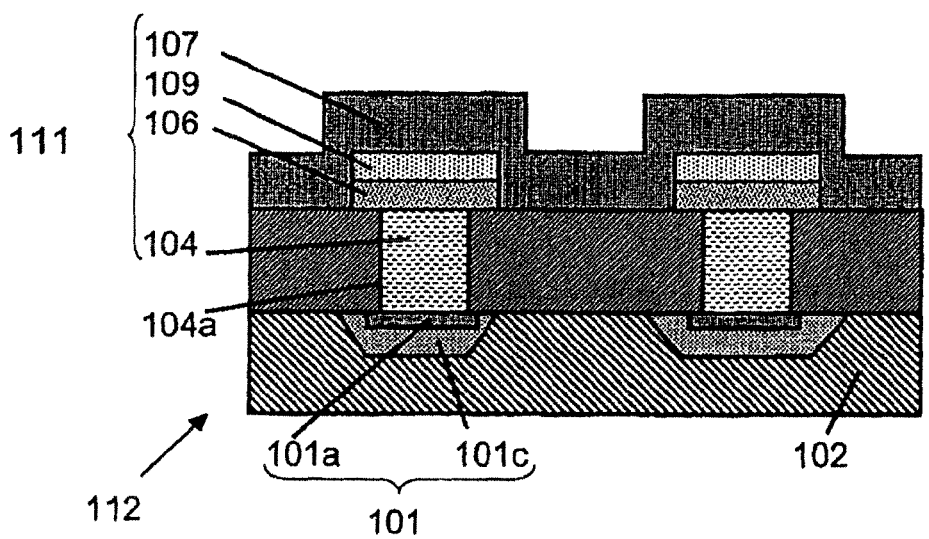
FIG. 1(b) is a cross-sectional view taken along one-dotted line of FIG. 1(a).

FIG. 1(b) is a cross-sectional view taken along one-dotted line of FIG. 1(a).

As shown in FIG. 1(a), the nonvolatile semiconductor memory device 100 of Embodiment 1 includes a substrate 102 provided with a transistor 101, a first interlayer insulating layer 103 formed over the substrate 102 to cover the transistor 101, a first contact plug 104 penetrating the first interlayer insulating layer 103 and electrically connected to either a drain electrode 101a or a source electrode 101b of the transistor 101, and a second contact plug 105 penetrating the first interlayer insulating layer 103 and electrically connected to the other of the drain electrode 101a or the source electrode 101b of the transistor 101. The nonvolatile semiconductor memory device 100 further includes resistance variable layer 106 covering the entire first contact plug 104, a first wire 107 formed on the resistance variable layer 106, and second wire 108 covering a portion of the second contact plug 105. The resistance variable layer 106 has end surfaces coplanar with the end surfaces of the first wire 107.

In other words, the transistor 101 includes a first main electrode (drain electrode 101a), a second main electrode (source electrode 101b) and a control electrode (gate electrode 101e). The first main electrode is connected to the first contact plug 104, while the second main electrode is connected to the second contact plug 105. Which of the first main electrode and the second main electrode is the drain electrode or the source electrode is not particularly limited, but they may be reversed.

The resistance variable layer 106 covers the entire upper end surface of the first contact plug 104 (this upper end surface is coplanar with the upper end surface of the interlayer insulating layer 103). Although it will be sufficient that the resistance variable layer 106 covers a portion of the upper end surface of the first contact plug 104, the resistance variable layer 106 desirably covers the entire upper end surface of the first contact plug 104 like this embodiment.

The first wire 107 includes an electrode layer 109 comprising at least precious metal on the surface contacting the resistance variable layer 106. The electrode layer 109 comprises, for example, platinum. By joining the first wire 107 to the resistance variable layer 106 via the electrode layer 109 comprising precious metal such as platinum, adhesiveness between the first wire 107 and the resistance variable layer 106 is improved, and the electrode layer including the first wire 107 which is operable and the electrode layer 109 comprising precious metal based material are implemented with a structure easily integrated without increasing a cell size.

Since unnecessary portions of the electrode layer 109 and unnecessary portions of the resistance variable layer 106 are removed using the first wire 107 as a mask in a photolithography step as described later, an end surface including an end surfaces of the resistance variable layer 106 and the end surface of the first wire 107 is planarized.

On a surface of the substrate 102, a drain region 101c is formed to underlie the drain electrode 101a, while a source region 101d is formed to underlie the source electrode 101b. A gate electrode 101e is formed between the drain electrode 101a and the source electrode 101b.

A first contact hole 104a and a second contact hole 105a are formed to penetrate the first interlayer insulating layer 103 such that the first contact hole 104a is filled with the first contact plug 104, and the second contact hole 105a is filled with the second contact plug 105.

A resistance variable element 111 includes an upper electrode consisting of the first wire 107 and the electrode layer 109, a lower electrode consisting of the first contact plug 104, and the resistance variable layer 106 sandwiched between the upper electrode and the lower electrode, and has a miniaturized structure at a bottom portion of the first wire 107. The resistance variable element 111 and the corresponding transistor 101 are coupled to each other in series, thereby forming a memory cell 112.

The resistance variable layer 106 may comprise a material including at least tantalum oxide.

In the above configuration, it is possible to implement a nonvolatile semiconductor memory device 100 which has a reversible and stable rewrite characteristic and a good resistance value retention characteristic as well as high-speed operability and can be manufactured in a manufacturing process which is highly compatible with a standard Si semiconductor process.

Figure 1C:
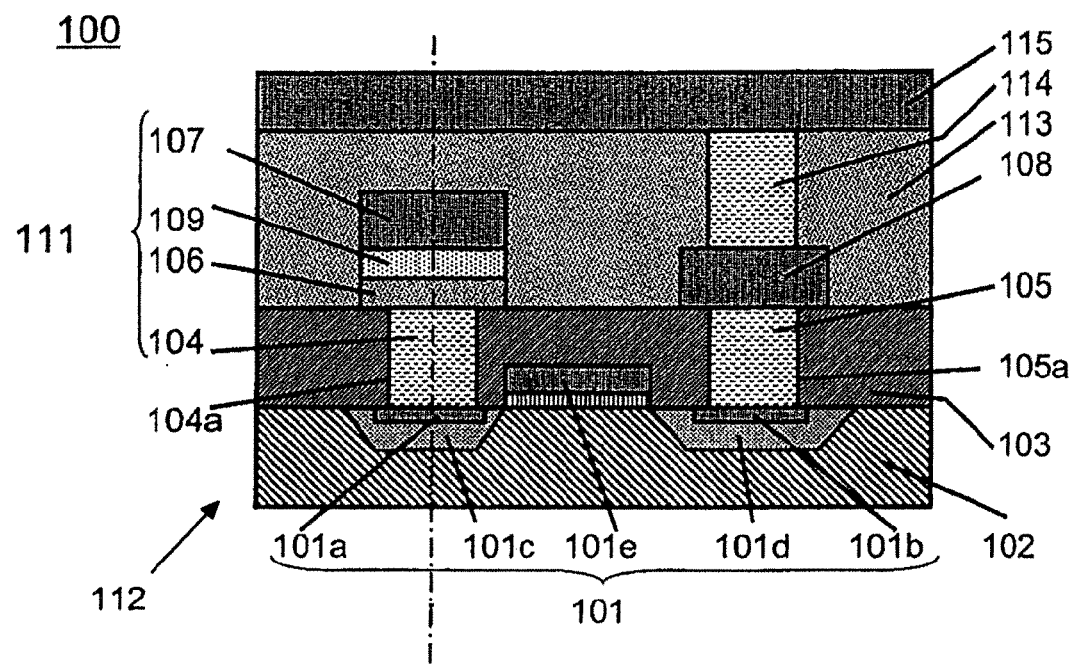
FIG. 1(c) is a cross-sectional view showing a detail of an exemplary configuration of an array of the nonvolatile semiconductor memory device 100 according to Embodiment 1 of the present invention.
Figure 1D:
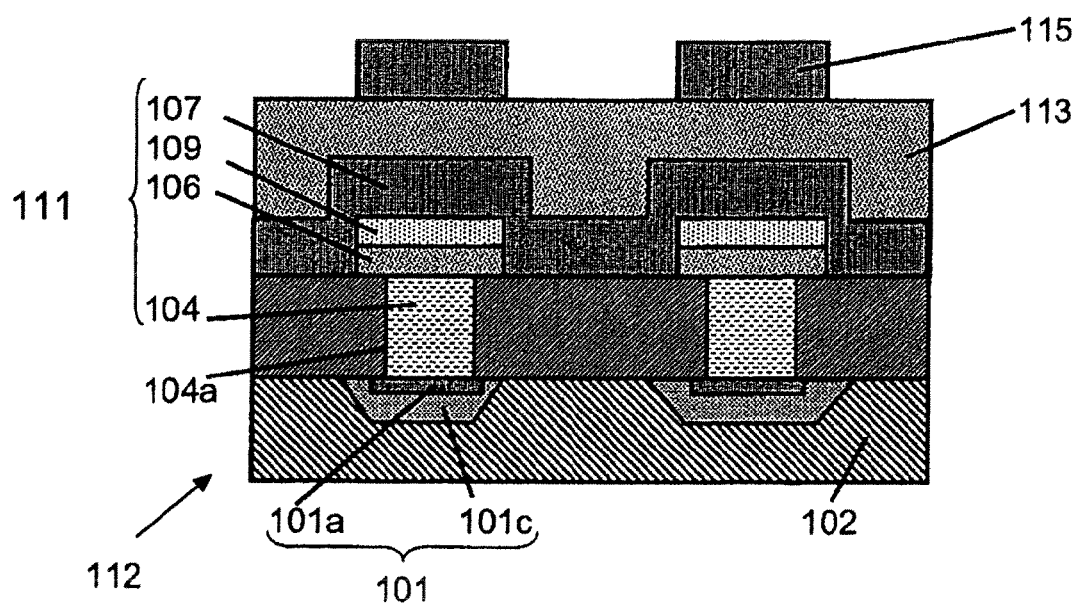
FIG. 1(d) is a cross-sectional view taken along one-dotted line of FIG. 1(c).

FIG. 1(c) is a cross-sectional view showing a detail of an exemplary configuration of an array of the nonvolatile semiconductor memory device 100 according to Embodiment 1 of the present invention. FIG. 1(d) is a cross-sectional view taken along one-dotted line of FIG. 1(c).

As shown in FIGS. 1(c) and 1(d), the second wire 108 is connected to the third wire 115 via third contact 114 penetrating a second interlayer insulating layer 113 formed over the interlayer insulating layer 103. The first wire 107 crosses the third wire 115 perpendicularly to the third wire 115 when viewed in the thickness direction of the substrate 102.

Figure 1E:
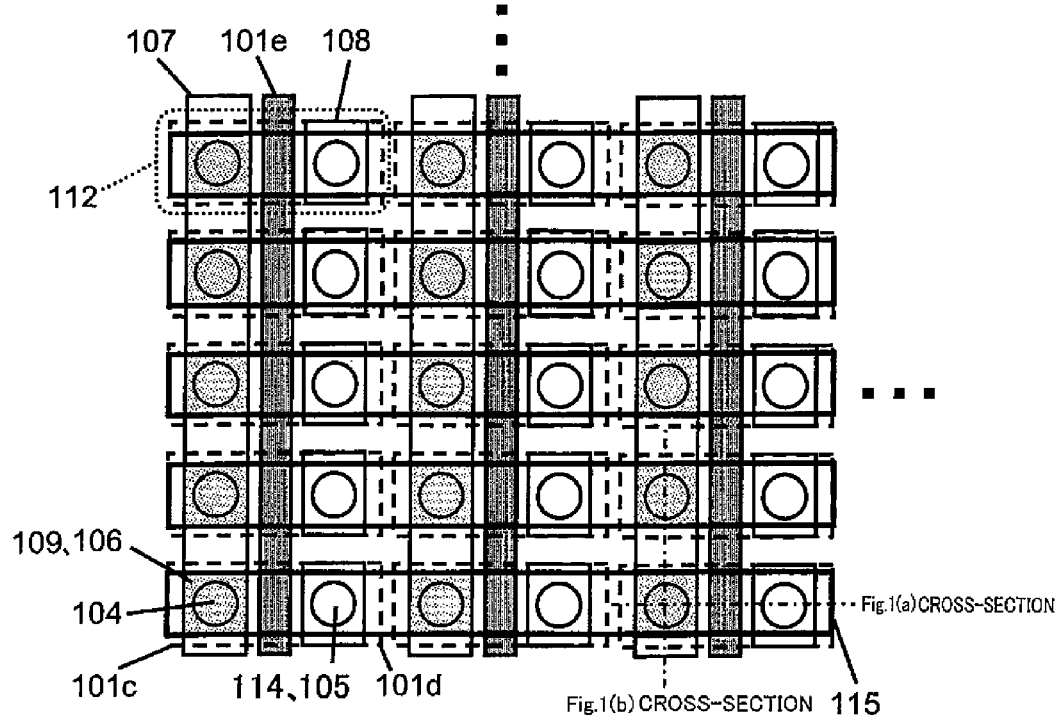
FIG. 1(e) is a plan view showing a detail of the exemplary configuration of the array of the nonvolatile semiconductor memory device 100 according to Embodiment 1 of the present invention.

FIG. 1(e) is a plan view showing a detail of the exemplary configuration of the array of the nonvolatile semiconductor memory device 100 according to Embodiment 1 of the present invention.

One gate electrode 101e of the transistor is shared by a plurality of elements, while the source region 101c and the drain region 101d are independently formed to respectively correspond to the elements. One first wire 107 is shared by a plurality of elements and one third wire 115 is shared by a plurality of elements. The electrode layer 109 and the resistance variable layer 106 which have a rectangular shape are formed on the first contact plug 104 individually formed.

The second wire 108 is formed to cover the entire upper end surface of the second contact plug 105. The third contact plug 114 is formed on the second wire 108. The third wire 115 is formed to cover the entire upper end surfaces of the plurality of third contact plugs 114, respectively. In other words, the drain electrode 101b is electrically connected to the third wire 115 via the second contact plug 105, the second wire 108 and the third contact plug 114.

In other words, the nonvolatile semiconductor memory device 100 includes the first wire 107 extending in parallel with each other in a first direction within a first plane parallel to a main surface of the substrate 102, and the third wire 115 extending in parallel with each other in a second direction three-dimensionally crossing the first direction within a second plane parallel to the first plane. When viewed in the thickness direction of the substrate 102, the first wire 107 cross the third wire 115 perpendicularly to the third wire 115.

At three-dimensional cross-points of the first wire 107 and the third wire 115, the source electrode 101a are formed on the substrate in regions below the first wire 107. The drain electrode 101b is formed on the substrate in regions below the third wire 115, where the first wire 107 is not present. The gate electrode 101e is embedded in the interlayer insulating layer 103, between the source electrode 101a and the drain electrode 101b. The first wire 107 and the third wire 115 are electrically connected to the plurality of memory cells 112.

Between the source electrode 101a and the first wire 107, the first contact plug 104 penetrating the interlayer insulating layer 103, the resistance variable layer 106 covering the entire upper end surface of the first contact plug 104, and the electrode layer 109 are stacked together in this order.

When the direction (rightward and leftward direction in FIG. 1(b)) in which the first wire 107 extend is a forward and rearward direction (first direction), the direction (direction perpendicular to the drawing sheet in FIG. 1(b)) which is perpendicular to the first direction and horizontal to the main surface of the substrate 102 is a rightward and leftward direction, and the direction perpendicular to the main surface of the substrate 102 (upward and downward direction in FIG. 1(b)) is an upward and downward direction, the end surfaces of the resistance variable layer 106 in the forward and rearward direction are covered with the first wire 107, the end surfaces of the resistance variable layer 106 in the forward and rearward direction are not coplanar with the end surfaces of the first wires 107 in the forward and rearward direction, the left end surface of the resistance variable layer 106 is coplanar with the left end surface of the first wire 107 as shown in FIG. 1(a), and the right end surface of the resistance variable layer 106 is coplanar with the right end surface of the first wire 107 as shown in FIG. 1(a). In the above description, which one is called right or left may be arbitrary.

The array has a feature that the plurality of resistance variable elements 111 are formed to underlie the first wires 107, which has an advantage in miniaturization.

Figure 1F:
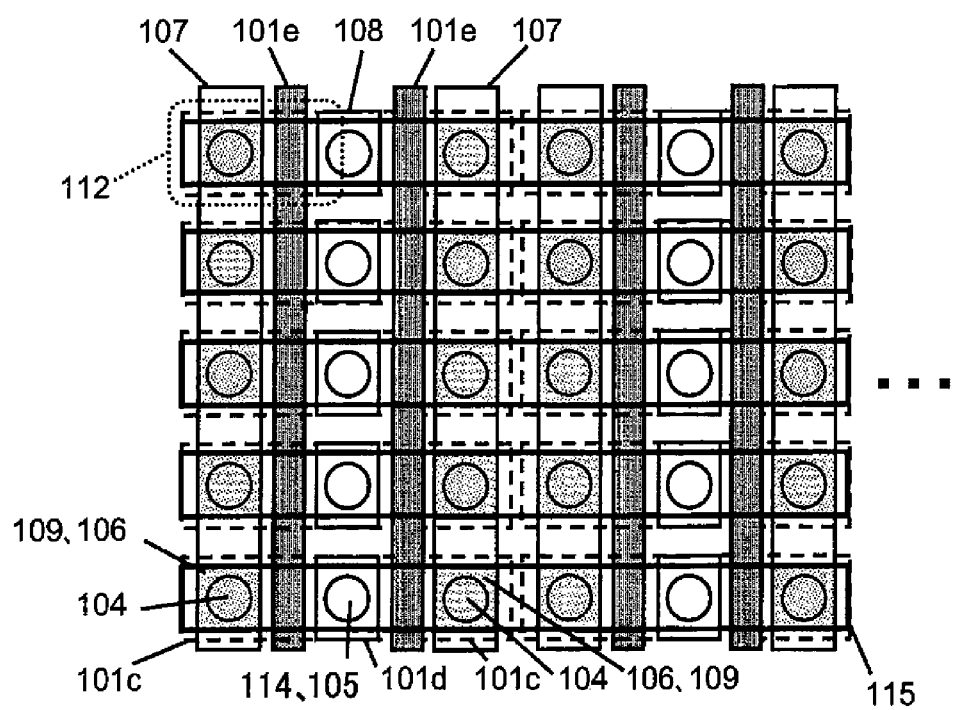
FIG. 1(f) is a plan view showing another exemplary configuration of the array of the nonvolatile semiconductor memory device 100 according to Embodiment 1 of the present invention.

FIG. 1(f) is a plan view showing another exemplary configuration of the array of the nonvolatile semiconductor memory device 100 according to Embodiment 1 of the present invention.

The difference between the configuration of FIG. 1(c) and the configuration of FIG. 1(f) is that in the configuration of FIG. 1(f), the second contact plug 105 and the second wire 108 are shared by adjacent memory cells 112. Because of this, the area of the memory cells 112 can be reduced, which has an advantage in miniaturization.

Next, an exemplary operation of the nonvolatile semiconductor memory device 100 of the present invention will be described.

Firstly, a case where the resistance value to be retained stably in the resistance variable elements 111 is changed and data is written to the nonvolatile semiconductor memory device 100 will be described. A threshold voltage required to change the resistance value of the resistance variable layer 106 is expressed as Vp.

The voltage Vp is applied to the first wire 107, a voltage 2Vp which is twice as large as Vp is applied to the second wire 108, and a predetermined voltage for turning ON the transistor 101 is applied to the gate electrode 101e. Thus, the voltage 2Vp is applied to the first contact plug 104 which is the lower electrode of the resistance variable element 111 via the second contact plug 105 and the transistor 101.

Since the voltage Vp is applied between the first contact plug 104 and the first wire 107 which is the upper electrode, in the resistance variable element 111, the resistance value of the resistance variable layer 106 changes, thereby allowing new data to be written to the resistance variable element 111.

When the voltage Vp is applied to the first wire 107, a voltage 0V is applied to the second wire 108, and the transistor 101 is turned ON, a voltage—Vp is applied between the first wire 107 which is the upper electrode and the first contact plug 104 which is the lower electrode in the resistance variable element 111, via a path similar to the above, thereby allowing data which is different from the above data to be written to the resistance variable element 111.

Next, a data read operation of the nonvolatile semiconductor memory device 100 will be described. The voltage Vp is applied to the first wire 107, a voltage (Vp+Δ V) which is an intermediate value between the voltage Vp and the voltage 2Vp is applied to the second wire 108, and a predetermined voltage is applied to the gate electrode 101e to turn ON the transistor 101. Thus, similarly to the above case, the voltage Δ V which is lower than the threshold voltage Vp is applied to the resistance variable element 111. In this case, data of the resistance variable element 111 remain unchanged, and a current corresponding to the resistance value retained stably in the resistance variable element 111 flows through the resistance variable element 111. By reading this current, the data stored in the resistance variable element 111 can be read.

In the above configuration, the 1T1R-type memory cell 112 is formed. The lower electrode of the resistance variable element 111 and the first contact plug 104 are constituted by an identical constituent, while the upper electrode of the resistance variable element 111 and the first wire 107 are constituted by an identical constituent. As a result, the memory cell is allowed to have a simplified and miniaturized structure. Since the end surfaces of the resistance variable layer 106 are coplanar with the end surfaces of the first wire 107 (they are located on the same plane), the memory cell can be miniaturized without providing a margin allowing for alignment between different masks used to form the resistance variable layer 106 and the first wire 107 separately. Since the resistance variable layer 106 can be formed by adding one mask to a standard Si semiconductor process as described later, it is possible to implement a nonvolatile semiconductor memory device at a reduced process cost without increasing the number of process steps.

FIGS. 2(a) to 2(d) are cross-sectional views showing a manufacturing method of the nonvolatile semiconductor memory device 100 according to Embodiment 1.

The manufacturing method of the nonvolatile semiconductor memory device 100 of Embodiment 1 will be described with reference to FIGS. 2(a) to 2(d).

Figure 2:
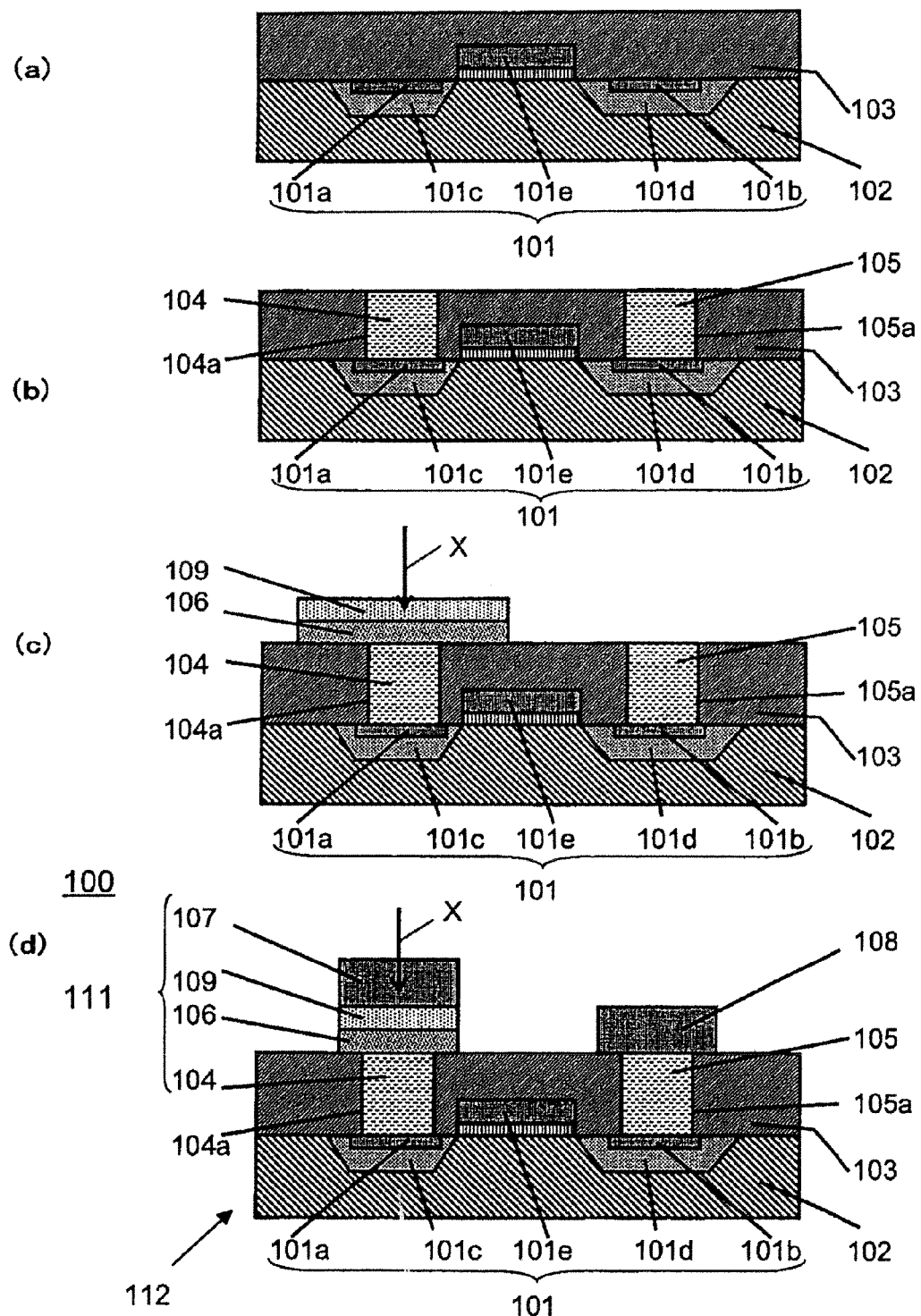
FIGS. 2(a) to 2(d) are cross-sectional views showing a manufacturing method of the nonvolatile semiconductor memory device according to Embodiment 1 of the present invention.

As shown in FIG. 2, the manufacturing method of Embodiment 1 includes a step of forming a first interlayer insulating layer 103 over a substrate 102 provided with a transistor 101, a step of forming a first contact plug 104 and a second contact plug 105, a step of forming a resistance variable layer 106, a step of forming a first wire 107 and a step of forming a second wire 108.

Initially, as shown in FIG. 2(a), in the step of forming the first interlayer insulating layer 103, the first interlayer insulating layer 103 is formed over the substrate 102 provided with the transistor 101 to cover the transistor 101.

Then, as shown in FIG. 2(b), in the step of forming the first contact plug 104 and the second contact plug 105, a first contact hole 104a is formed on either a drain electrode 101a or a source electrode 101b of the transistor 101 to penetrate the first interlayer insulating layer 103, the second contact hole 105a is formed on the other of the drain electrode 101 a or the source electrode 101b of the transistor 101 to penetrate the first interlayer insulating layer 103, and the first contact plug 104 and the second contact plug 105 are formed such that the first contact plug 104 is filled into the first contact hole 104a, and the second contact plug 105 is filled into the second contact hole 105a.

Then, as shown in FIG. 2(c), in the step of forming the resistance variable layer 106, the resistance variable layer 106 and the electrode layer 109 are formed to cover the entire opening of a first contact hole 104a. As the electrode layer 109, precious metal material, for example, platinum layer may be used to enable the resistance variable layer 106 to operate well, i.e., easily change resistance.

The resistance variable layer 106 and the electrode layer 109 are formed in such a manner that a resistance variable material and an electrode material are deposited over the entire upper surface of the interlayer insulating layer 103, a mask (photoresist or the like) having a predetermined shape is provided over the materials, and then etching is conducted using the mask.

Then, as shown in FIG. 2(d), in the step of forming the wire layer 107 and the wire layer 108, a step of forming the first wire 107 which are also used as a mask for covering a portion of the resistance variable layer 106 and a portion of the electrode layer 109 to remove a remaining portion of the resistance variable layer 106 and a remaining portion of the electrode layer 109, and a step of forming the second wire 108 such that the second wire 108 covers a portion of the second contact plug 105, is performed, thereby manufacturing the nonvolatile semiconductor memory device 100.

The first wire 107 and the second wire 108 are formed in such a manner that a wire material is deposited over the entire upper surface of the interlayer insulating layer 103 to cover the resistance variable layer 106 and the electrode layer 109, then a mask (photoresist or the like) having a predetermined shape is provided over the wire material, and then etching is conducted using the mask. In this case, the resistance variable layer 106 and the electrode layer 109 may be etched successively concurrently with the formation of the first wire 107, or the photoresist may be removed after forming the first wire 107, and then the resistance variable layer 106 and the electrode layer 109 may be etched using the first wire 107 as a mask.

The first wire 107 and the second wire 108 may be formed simultaneously concurrently in the same step. In this case, the step for forming the first wire 107 is also the step for forming the second wire 108.

If the first wire 107 serve as the electrode of the resistance variable layer 106, then electrode layer 109 may be omitted to make the manufacturing method simpler.

In such a method, a 1T1R-type memory cell 112 is formed, and the lower electrode of the resistance variable element 111 and the first contact plug 104 are constituted by an identical constituent, while the upper electrode of the resistance variable element 111 and the first wire 107 are constituted by an identical constituent, thereby resulting in a simplified and miniaturized structure of the memory cell 112. Since the resistance variable layer 106 can be formed by adding one mask to a standard Si semiconductor process, for example, a CMOS manufacturing process, it is possible to implement the nonvolatile semiconductor memory device 100 at a reduced process cost without increasing the number of process steps.

One reason why the number of required masks can be made less is that the left end surface of the resistance variable layer is coplanar with the left end surface of the first wire and the right end surface of the resistance variable layer are coplanar with the right end surface of the first wire. This makes it possible to determine the shape of the resistance variable layer using the first wire (or mask such as the photoresist for forming the first wire) as a mask. In other words, by using the first wire (or mask such as the photoresist for forming the first wire) as the mask for the resistance variable layer, the number of required masks can be reduced.

Figure 15:
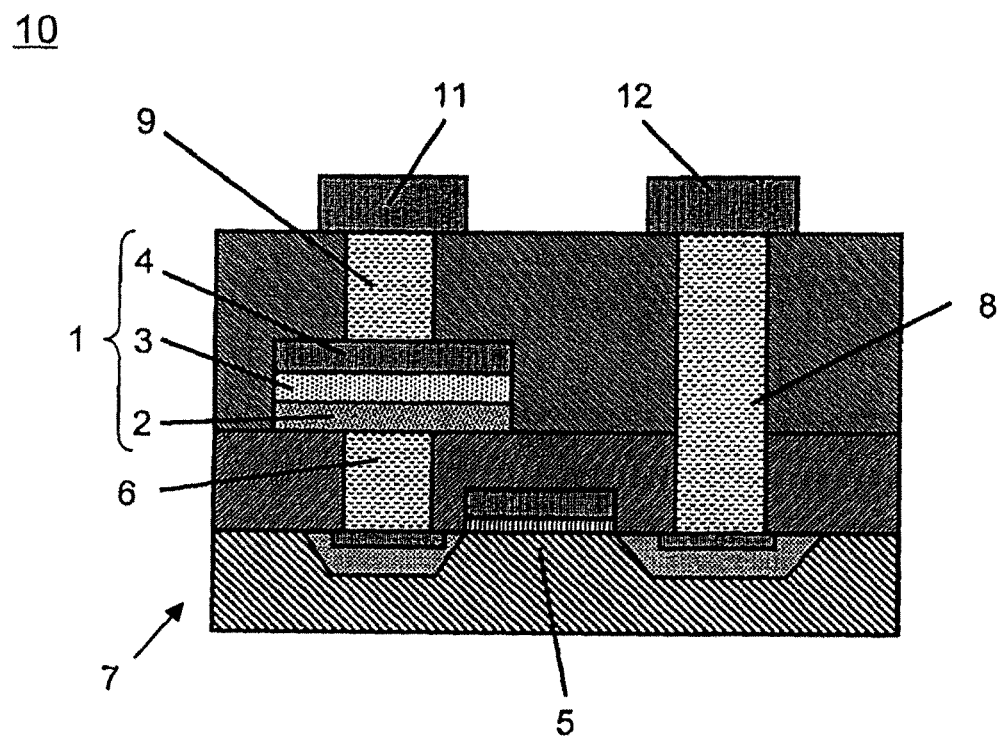
FIG. 15 is a cross-sectional view of a conventional general nonvolatile semiconductor memory device.

In a case where the resistance variable layer 106 is formed independently like the example of FIG. 15, it is necessary to ensure adhesiveness of a photoresist to the resistance variable layer 106 to surely implement a square shape. Therefore, an element area must be set relatively larger. In this embodiment, the resistance variable layer 106 is formed at regions where line-shaped resistance variable material and line-shaped wire material cross each other. The line-shaped resistance variable material can be set to have a smaller width than a square resistance variable material. As a result, the element area can be made smaller than that of the example of FIG. 15.

As shown in FIG. 2(c), a precious metal layer, for example, a platinum layer may be formed between the resistance variable layer 106 and the first wire 107.

Figure 3:
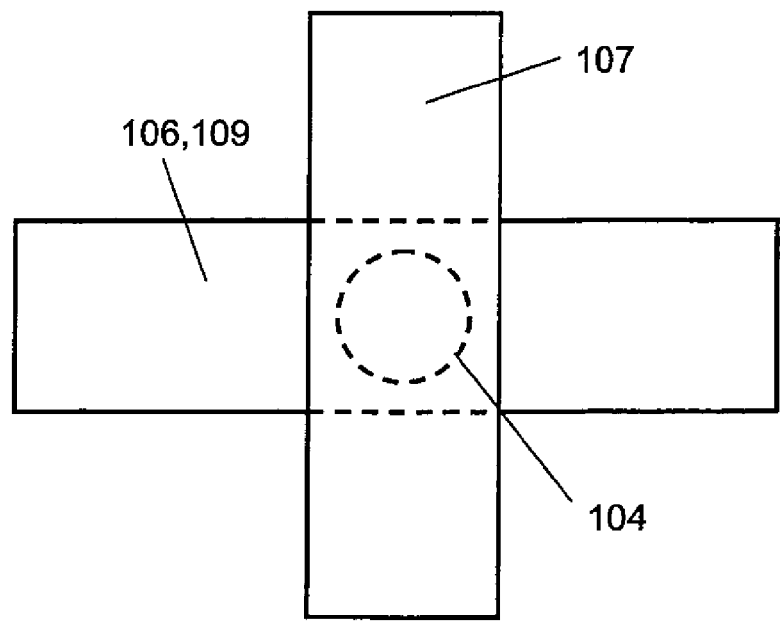
FIGS. 3(a) and 3(b) are plan views of enlarged major constituents of the nonvolatile semiconductor memory device which are when viewed in the direction of arrow X of FIGS. 2(c) and 2(d).
Figure 3:
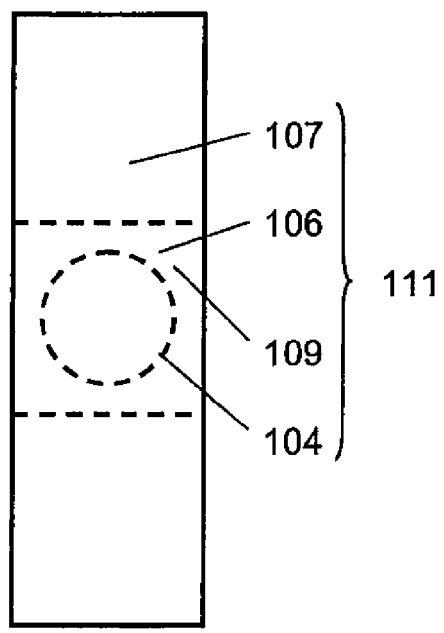

FIGS. 3(a) and 3(b) are plan views of enlarged major constituents of the nonvolatile semiconductor memory device 100 which are when viewed in the direction of arrow X of FIGS. 2(c) and 2(d).

FIG. 3(a) shows a state where the first wire 107 is formed on the resistance variable layer 106 and the electrode layer 109 in the configuration of FIG. 2(c) but a portion of the resistance variable layer 106 and a portion of the electrode layer 109 which protrude outward to the right and to the left are not removed yet.

As shown in FIG. 3(a), the first wire 107 of a rectangular shape is formed on the resistance variable layer 106 and the electrode layer 109 of a rectangular shape covering the first contact plug 104 such that the first wire 107 crosses the resistance variable layer 106 and the electrode layer 109 perpendicularly to the resistance variable layer 106 and the electrode layer 109. The first wire 107 comprises a conductive material such as Al. By using the first wire 107 as a mask, an unnecessary portion of the resistance variable layer 106 and an unnecessary portion of the electrode layer 109 are removed, thereby manufacturing the resistance variable element 111 having a miniaturized structure as shown in FIG. 3(b).

The resistance variable layer 106 may comprise a material including at least tantalum oxide.

In such a method, it is possible to implement a manufacturing process which provides a reversible and stable rewrite characteristic and a good resistance value retention characteristic as well as high-speed operability and is highly compatible with a standard Si semiconductor process.

Although in the exemplary configuration of the nonvolatile semiconductor memory device 100 according to Embodiment 1 of the present invention, an end surface of the resistance variable layer 106 is coplanar with an end surface of the first wire 107 (their end surfaces are on the same plane), these end surfaces may have unevenness depending on a variation in the shapes during manufacturing process steps (etching, etc). Although the first contact plug 104 is directly connected to the drain electrode 101a of the transistor, and the second contact plug 105 is directly connected to the source electrode 101b of the transistors, wire, contact plug or the like may intervene between the first contact plug 104 and the drain electrode 101a and between the second contact plug 105 and the source electrode 101b so long as electric connection is formed between them.

[Modification A]

Figure 16:
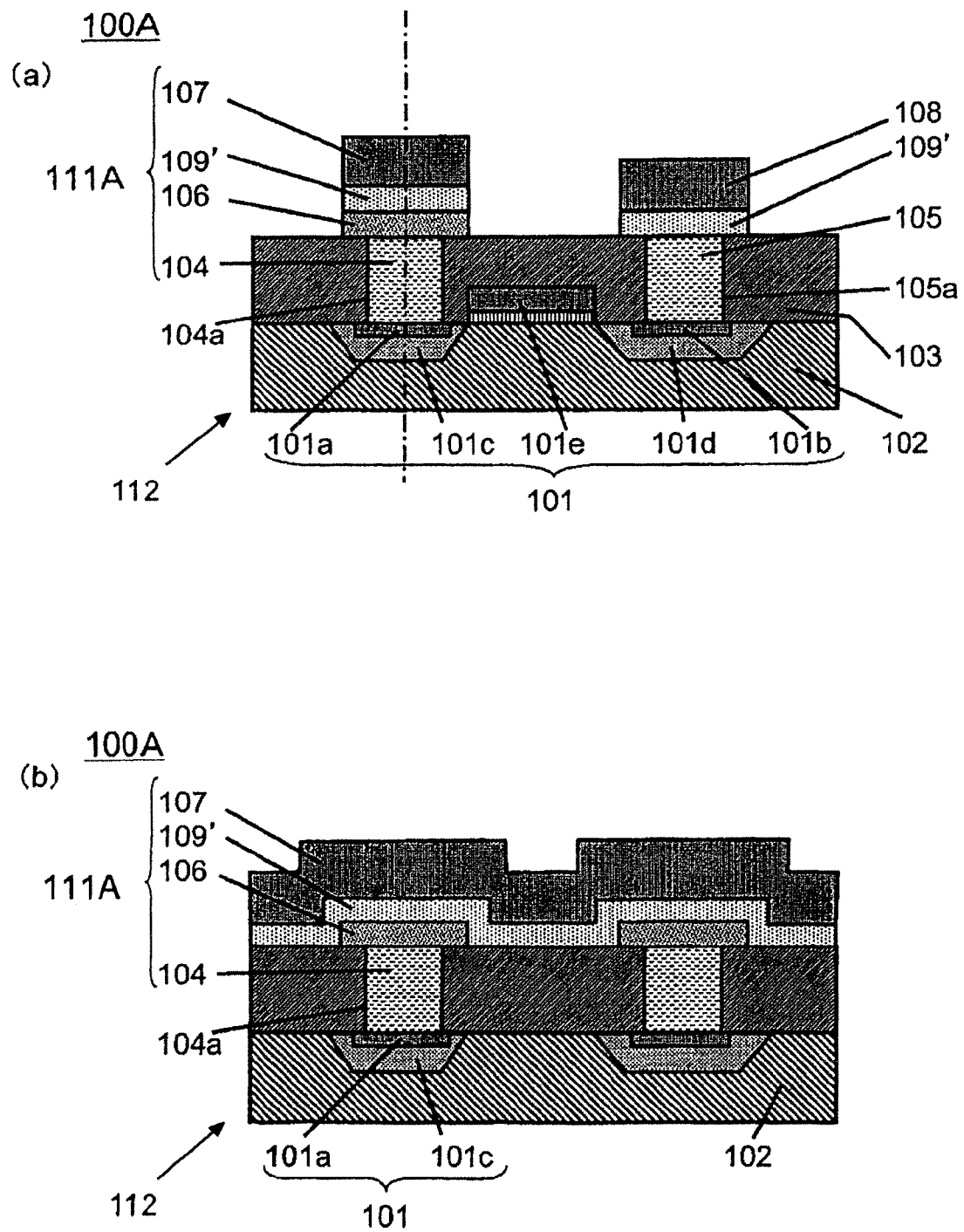
FIG. 16(a) is a cross-sectional view showing an exemplary configuration of a nonvolatile semiconductor memory device 100A according to modification A of Embodiment 1 of the present invention.
FIG. 16(b) is a cross-sectional view taken along one-dotted line in the cross-sectional view of FIG. 16(a).

FIG. 16(a) is a cross-sectional view showing an exemplary configuration of a nonvolatile semiconductor memory device 100A according to modification A of Embodiment 1 of the present invention, and FIG. 16(b) is a cross-sectional view taken along one-dotted line in the cross-sectional view of FIG. 16(a).

The difference between the nonvolatile semiconductor memory device 100A and the nonvolatile semiconductor memory device 100 of FIG. 1(a) will be described. In the nonvolatile semiconductor memory device 100, the electrode layer 109 has the same shape as the resistance variable layer 106 when viewed in the thickness direction of the substrate 102 (see FIG. 1(c)). In contrast, in the nonvolatile semiconductor memory device 100A, electrode layer 109' have the same shape as the first wire 107 when viewed in the thickness direction of the substrate 102 (see FIG. 16(b)). To be specific, the first wire 107 and the electrode layer 109' extend in a first direction, and the width (width in the rightward and leftward direction in a case where the first direction is a forward and rearward direction and a thickness direction of a substrate is an upward and downward direction) of the first wire 107 is equal to the width (width in the rightward and leftward direction) of the electrode layer 109'.

In the nonvolatile semiconductor memory device 100, the electrode layer 109 is isolated for each of the memory cells 112. In contrast, in the nonvolatile semiconductor memory device 100A, the electrode layer 109' is shared by a plurality of memory cells 112. In such a configuration, flexibility of microfabrication of the electrode layer is improved and cells of further miniaturized configuration are easily formed in array.

FIGS. 17(a) to 17(d) are cross-sectional views showing a manufacturing method of the nonvolatile semiconductor memory device 100A according to modification A of Embodiment 1. The difference between the manufacturing method of the nonvolatile semiconductor memory device 100 and the manufacturing method of the nonvolatile semiconductor memory device 100A will be described. FIGS. 17(a) and 17(b) are similar to FIGS. 2(a) and 2(b), and therefore, will not be described in detail.

FIG. 17(c) is a view showing a step of forming the resistance variable layer 106. In this step, the resistance variable layer 106 is formed to cover the entire opening of a first contact hole 104a (cover entire upper end surface of the first contact plug 104). In this case, the electrode layer 109 is not formed, but a resistance variable material is deposited over the entire surface of the interlayer insulating layer 103 and then etched using a desired mask, to form only the resistance variable layer 106.

FIG. 17(d) is a view showing a step of forming the first wires 107 and the second wires 108. In this step, a step of forming the electrode layer 109' and the first wire 107 located thereabove, which is also used as a mask for covering a portion of the resistance variable layer 106 to remove a remaining portion of the resistance variable layer 106, and a step of forming the electrode layer 109' and the second wire 108 located thereabove such that the electrode layer 109' and the second wire 108 cover a portion of the second contact plug 105, may be performed, thereby manufacturing the nonvolatile semiconductor memory device 100A.

Initially, the electrode layer 109', the first wire 107 and the second wire 108 may be formed in such a manner that an electrode material and a wire material are deposited over the entire upper surface of the interlayer insulating layer 103 to cover the resistance variable layer 106, and etched using a mask (photoresist, or the like) of a predetermined shape. In this case, the resistance variable layer 106 may be etched successively concurrently with the formation of the first wire 107 and the electrode layer 109'. Or, after the first wire 107 and the electrode layer 109' are formed, a photoresist may be removed, and the resistance variable layers 106 may be etched using the first wire 107 and the electrode layer 109' as a mask The first wire 107 and the second wire 108 may be formed simultaneously and concurrently in the same step. In this case, the step for forming the first wire 107 is also the step for forming the second wire 108.

If there is a large level difference between a base surface on which the first wire 107 is formed and a base surface on which the second wire 108 is formed, a problem such as disconnection tends to occur. When the electrode layer 109 is required to be provided because of a problem such as an electrode material for enabling the resistance change, there is a level difference corresponding to a sum of the resistance variable layer 106 and the electrode layer 109 in the configuration of FIG. 1(*b*), whereas there is a level difference corresponding to only the resistance variable layer 106 in the configuration of FIG. 17(*d*). In this modification, a focal depth in a lithography step associated with the first wire 107 and the second wire 108 can be improved, a process variation can be reduced, and further miniaturized wires can be formed.

Figure 17:
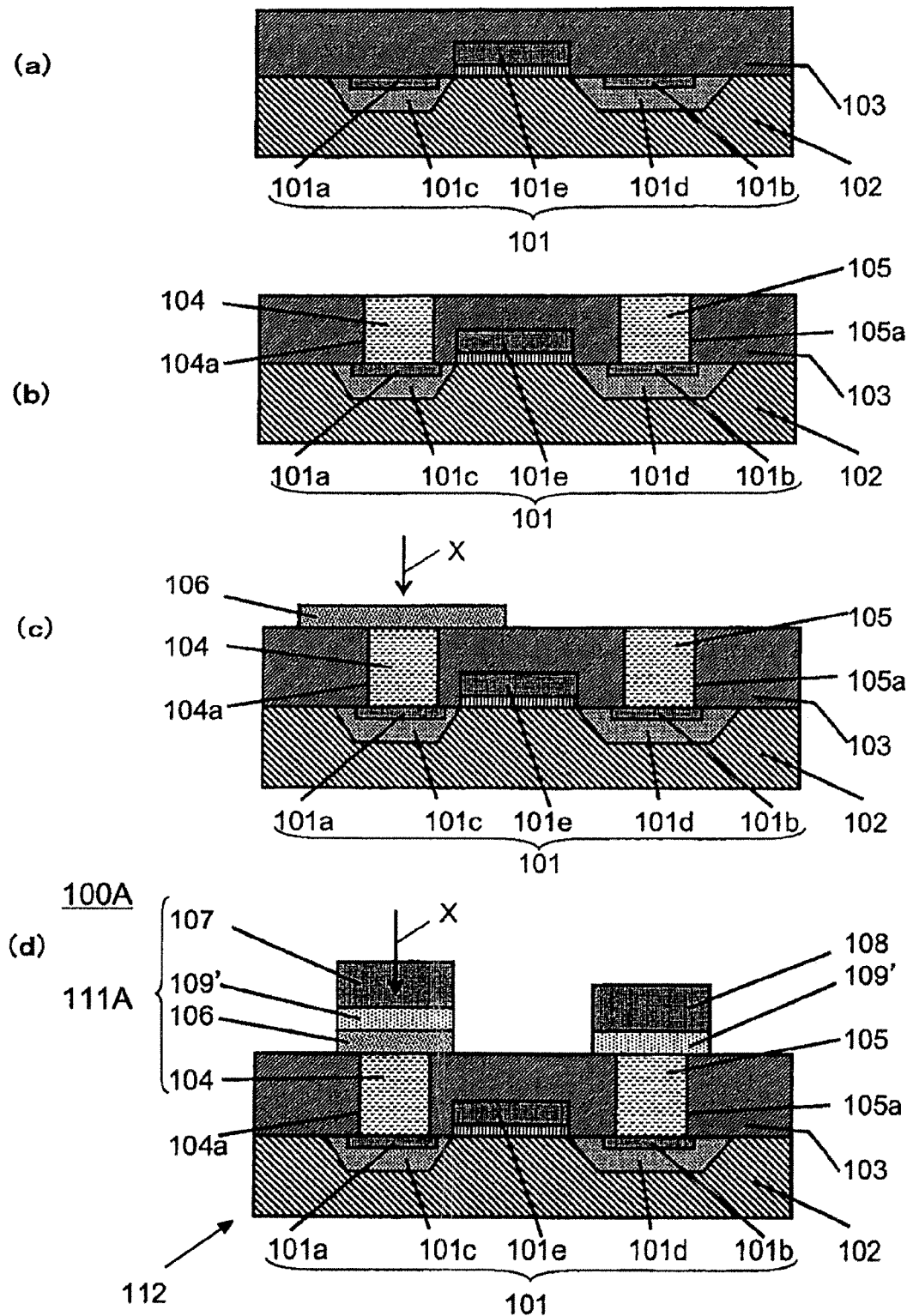
FIGS. 17(a) to 17(d) are cross-sectional views showing a manufacturing method of the nonvolatile semiconductor memory device 100A according to modification A of Embodiment 1 of the present invention.
Figure 18:
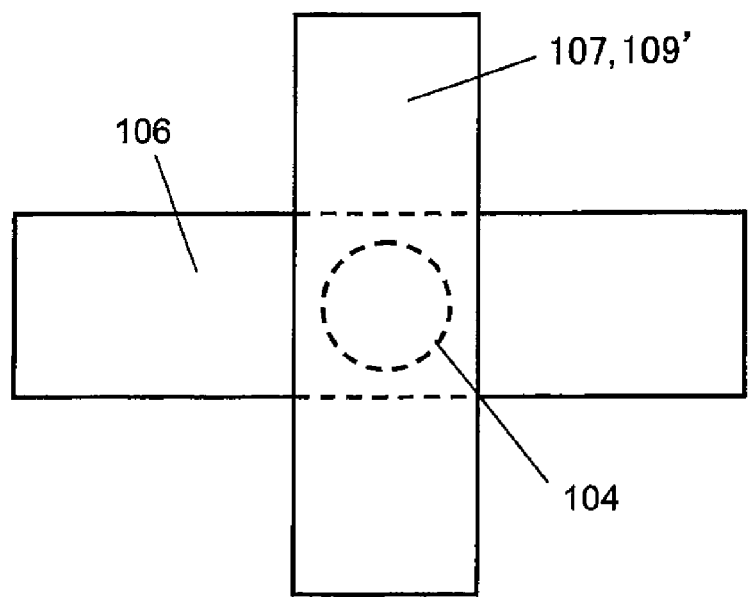
FIGS. 18(a) and FIG. 18(b) are plan views of enlarged major constituents of the nonvolatile memory device 100A which are viewed taken in the direction of arrow X of FIGS. 17(c) and 17(d), respectively.
Figure 18:
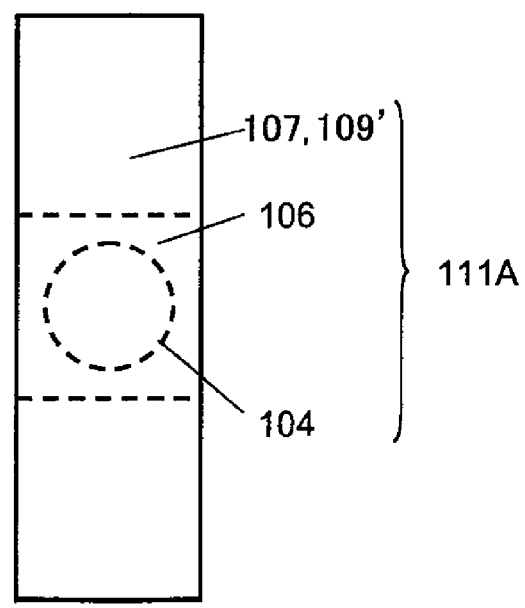

FIGS. 18(*a*) and FIG. 18(*b*) are plan views of enlarged major constituents of the nonvolatile memory device 100A which are viewed taken in the direction of arrow X of FIGS. 17(*c*) and 17(*d*), respectively.

FIG. 18(*a*) shows a state where the electrode layer 109' and the first wire 107 are formed on the resistance variable layer 106 in the configuration of FIG. 17(*c*) but a portion of the resistance variable layer 106 which protrudes outward to the right and to the left is not removed yet.

As shown in FIG. 18(*a*), on the resistance variable layer 106 of a rectangular shape covering the first contact plug 104, the first wire 107 and the electrode layer 109' of a rectangular shape (strip shape or line shape) are formed to cross the resistance variable layer 106 perpendicularly to the resistance variable layer 106. The first wire 107 comprises a conductive material such as Al. Using the first wire 107 as a mask, an unnecessary portion of the resistance variable layer 106 is removed, thereby manufacturing the resistance variable element 111A having a miniaturized structure as shown in FIG. 18(*b*).

[Modification B]

Figure 19:
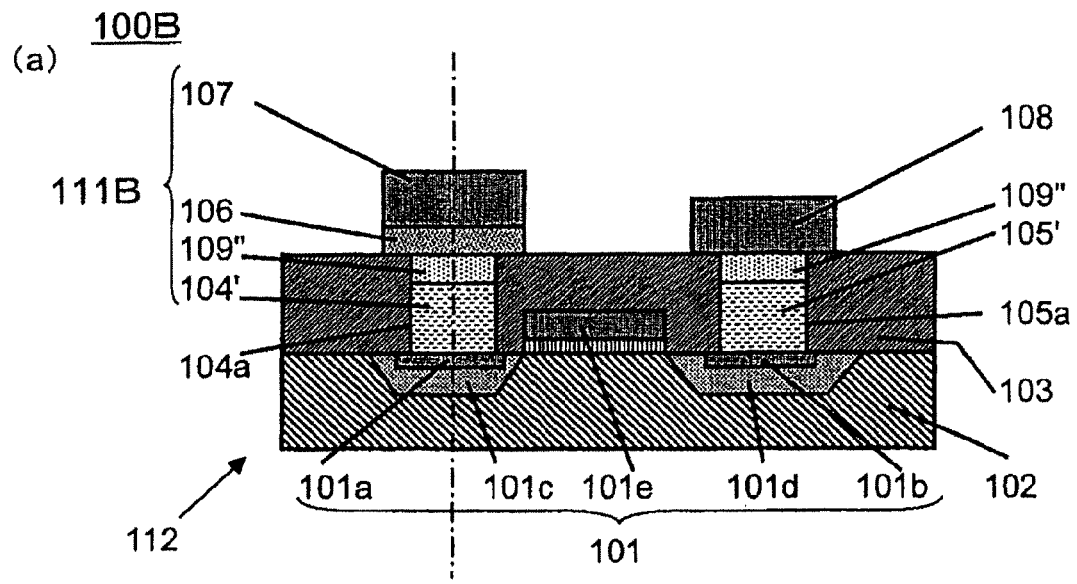
FIG. 19(a) is a cross-sectional view showing an exemplary configuration of a nonvolatile semiconductor memory device 100B according to modification B of Embodiment 1 of the present invention.
FIG. 19(b) is a cross-sectional view taken along one-dotted line in the cross-sectional view of FIG. 19(a).
Figure 19:
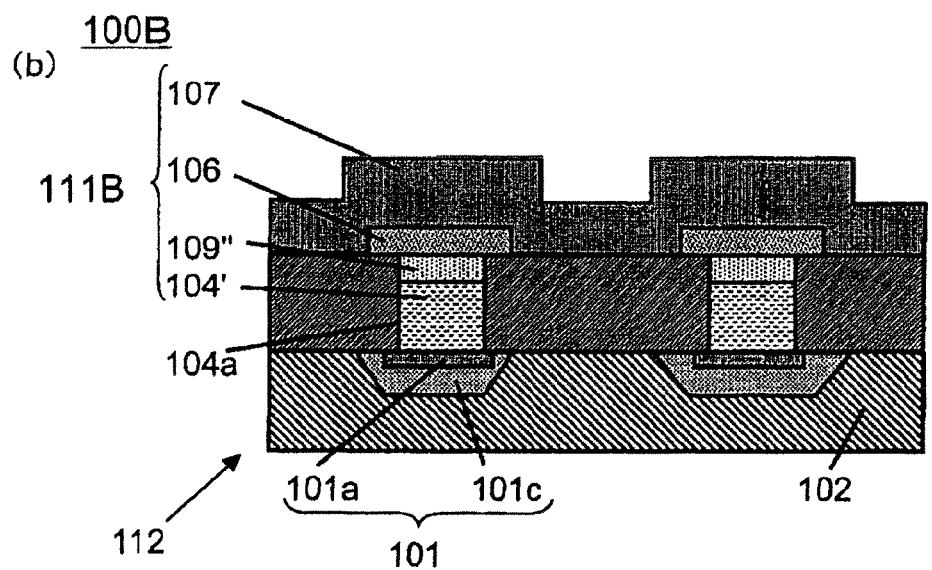

FIG. 19(*a*) is a cross-sectional view showing an exemplary configuration of a nonvolatile semiconductor memory device 100B according to modification B of Embodiment 1 of the present invention, and FIG. 19(*b*) is a cross-sectional view taken along one-dotted line in the cross-sectional view of FIG. 19(*a*).

The difference between the nonvolatile semiconductor memory device 100B and the nonvolatile semiconductor memory device 100 of FIG. 1(*a*) will be described. In the nonvolatile semiconductor memory device 100, the electrode layer 109 has the same shape as the resistance variable layer 106 when viewed in the thickness direction of the substrate 102 (see FIG. 1(*c*)). In contrast, in the nonvolatile semiconductor memory device 100B, electrode layer 109" is filled on filling layer 104' (inside the first contact hole 104a). The electrode layer 109" and the filling layer 104' constitute first contact plug. The filling layer 104' may be formed using the same material and the same method as those for the first contact plug 104 except that the upper end surface of the filling layer 104' is accommodated inside the first contact hole 104a (lower than the upper end surface of the interlayer insulating layer 103).

Figure 20:
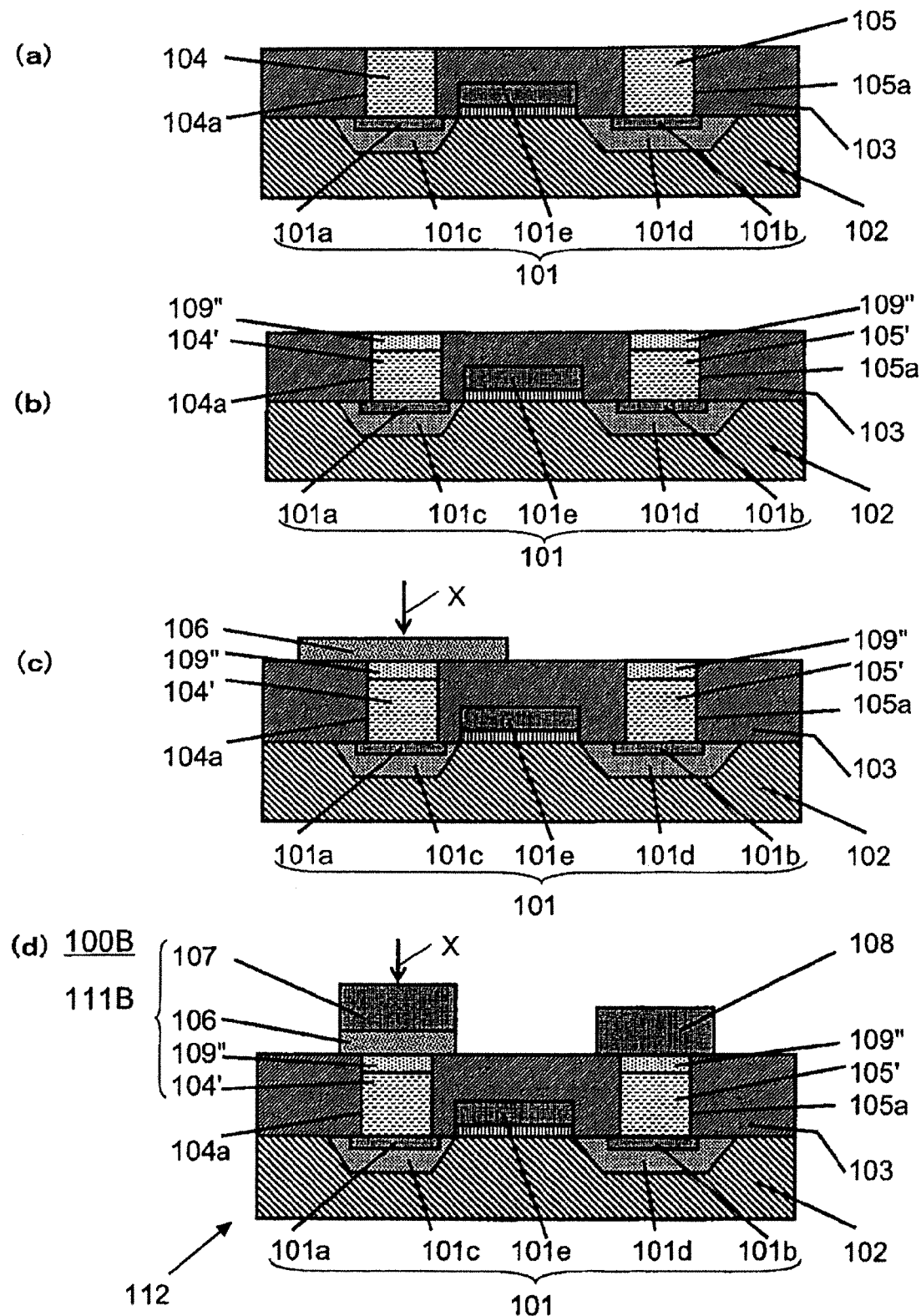
FIGS. 20(a) to 20(d) are cross-sectional views showing a manufacturing method of the nonvolatile semiconductor memory device 100B according to modification B of Embodiment 1.

FIGS. 20(*a*) to 20(*d*) are cross-sectional views showing a manufacturing method of the nonvolatile semiconductor memory device 100B according to modification B of Embodiment 1. The difference between the manufacturing method of the nonvolatile semiconductor memory device 100B and the manufacturing method of the nonvolatile semiconductor memory device 100 will be described. FIGS. 20(*a*), 20(*c*), and 20(*d*) are similar to FIGS. 2(*a*), 2(*c*), and 2(*d*), and will not be described in detail.

In the step of forming the electrode layer 109 of FIG. 20(*b*), recesses are formed at the upper portion of the first contact plug 104 and the upper portion of the second contact plug 105, by, for example, etch back, to form the filling layers 104' and 105'. An electrode material is deposited to completely fill the recesses on the filling layers 104' and 105'. Further, by CHIP, electrode material on the first interlayer insulating layer 103 is removed to form the electrode layer 109" filled into the recesses, respectively. The filling layer 104' and the electrode layer 109" constitute the first contact plug. The filling layer 105' and the electrode layer 109" constitute the second contact plug. The resistance variable layer 106 covers the entire upper end surface of the first contact plug(upper end surface of the electrode layer 109").

A "contact plug" is defined as a conductor filled into a contact hole. The contact plug may have a single layer or a plurality of layers. The upper end surface of the contact plug serves as the lower electrode of the resistance variable element.

In the above manufacturing method, even a material which is low in chemical reactivity can be patterned by mechanical polishing such as CMP without using etching. Therefore, the manufacturing method has an advantage that flexibility of microfabrication of the electrode layer is improved and cells of further miniaturized configuration are easily formed.

Figure 21:
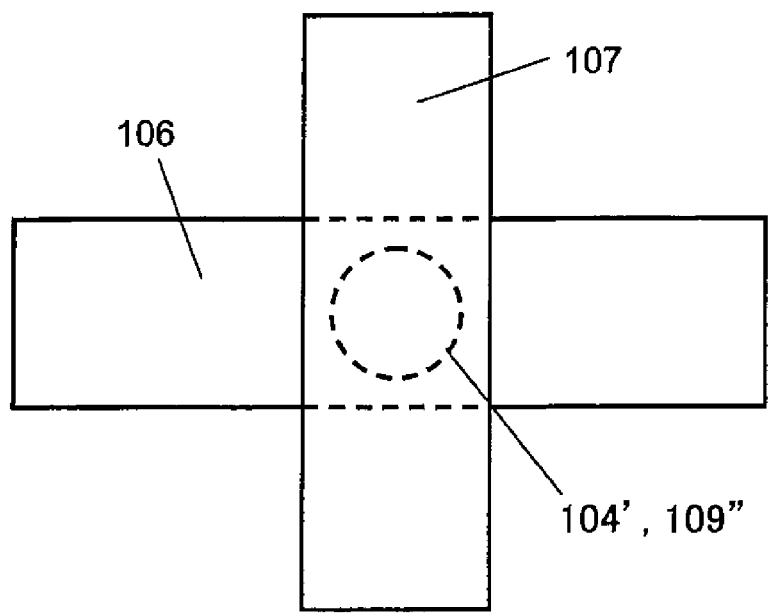
FIGS. 21(a) and FIG. 21(b) are plan views of enlarged major constituents of the nonvolatile memory device 100B which are viewed taken in the direction of arrow X of FIGS. 20(c) and 20(d), respectively.
Figure 21:
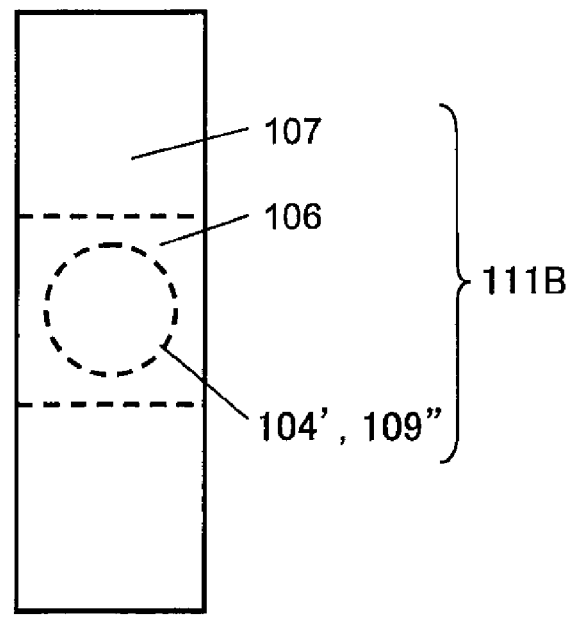

FIGS. 21(*a*) and FIG. 21(*b*) are plan views of enlarged major constituents of the nonvolatile memory device 100B which are viewed taken in the direction of arrow X of FIGS. 20(*c*) and 20(*d*), respectively.

FIG. 21(*a*) shows a state where the first wire 107 is formed on the resistance variable layer 106 in the configuration of FIG. 17(*c*) but a portion of the resistance variable layer 106 which protrudes outward to the right and to the left is not removed yet.

As shown in FIG. 21(*a*), the first wire 107 of a rectangular shape is formed on the resistance variable layer 106 of a rectangular shape covering the first contact plug (electrode layer 109") to cross the resistance variable layer 106 perpendicularly to the resistance variable layer 106. The first wire 107 comprise a conductive material such as Al. By using the first wire 107 as a mask, an unnecessary portion of the resistance variable layer 106 is removed, thereby manufacturing the resistance variable element 111B having a miniaturized structure as shown in FIG. 21(*b*).

[Modification C]

Figure 22:
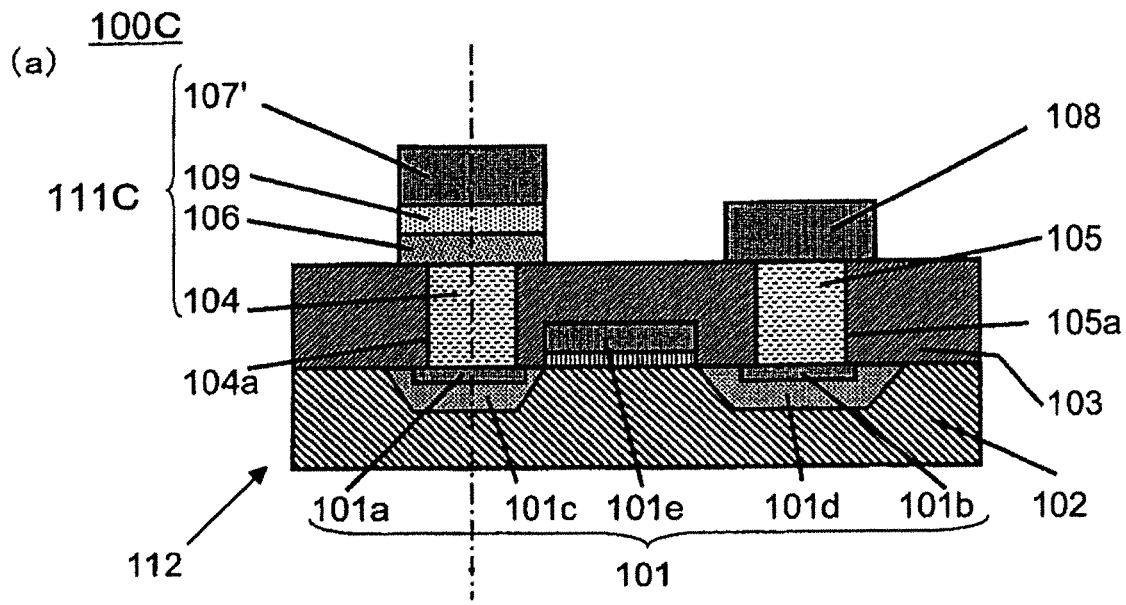
FIG. 22(a) is a cross-sectional view showing an exemplary configuration of a nonvolatile semiconductor memory device 100C according to modification C of Embodiment 1 of the present invention.
FIG. 22(b) is a cross-sectional view taken along one-dotted line in the cross-sectional view of FIG. 22(a).
Figure 22:
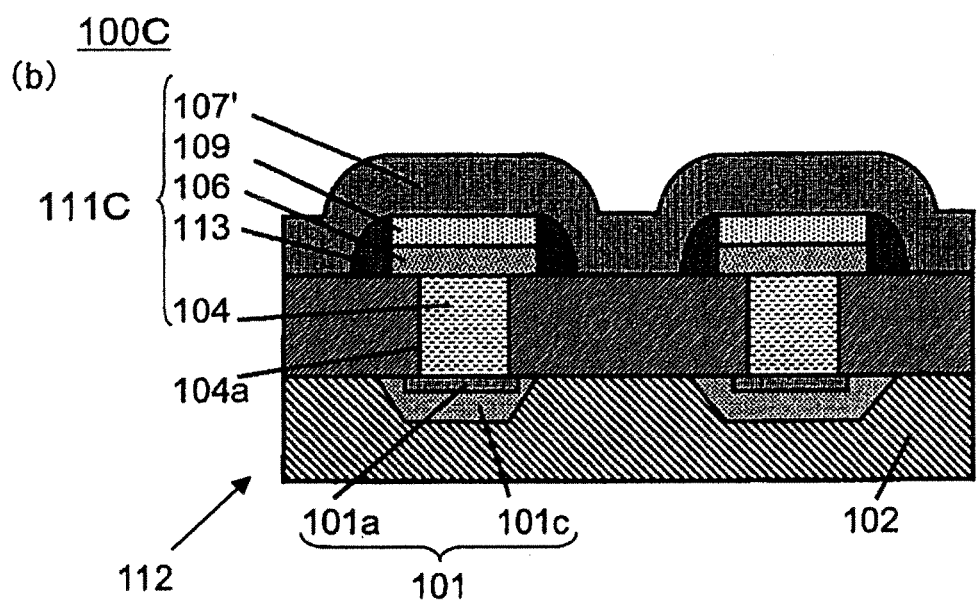

FIG. 22(a) is a cross-sectional view showing an exemplary configuration of a nonvolatile semiconductor memory device 100C according to modification C of Embodiment 1 of the present invention, and FIG. 22(b) is a cross-sectional view taken along one-dotted line in the cross-sectional view of FIG. 22(a).

The difference between the nonvolatile semiconductor memory device 100C and the nonvolatile semiconductor memory device 100 of FIG. 1(a) will be described. In the nonvolatile semiconductor memory device 100C, side wall insulating layer 113 is formed on the side walls of the electrode layer 109 and the side walls of the resistance variable layer 106 (end surfaces of the electrode layer 109 and end surfaces of the resistance variable layer 106 in the forward and rearward direction).

In the nonvolatile semiconductor memory device 100C, because of the side wall insulating layer 113, steps between the electrode layer 109 and the resistance variable layer 106 are lessened and the first wire 107' is less likely to be disconnected at the steps. In addition, a variation in wire resistance of the first wire 107' can be reduced.

Figure 23:
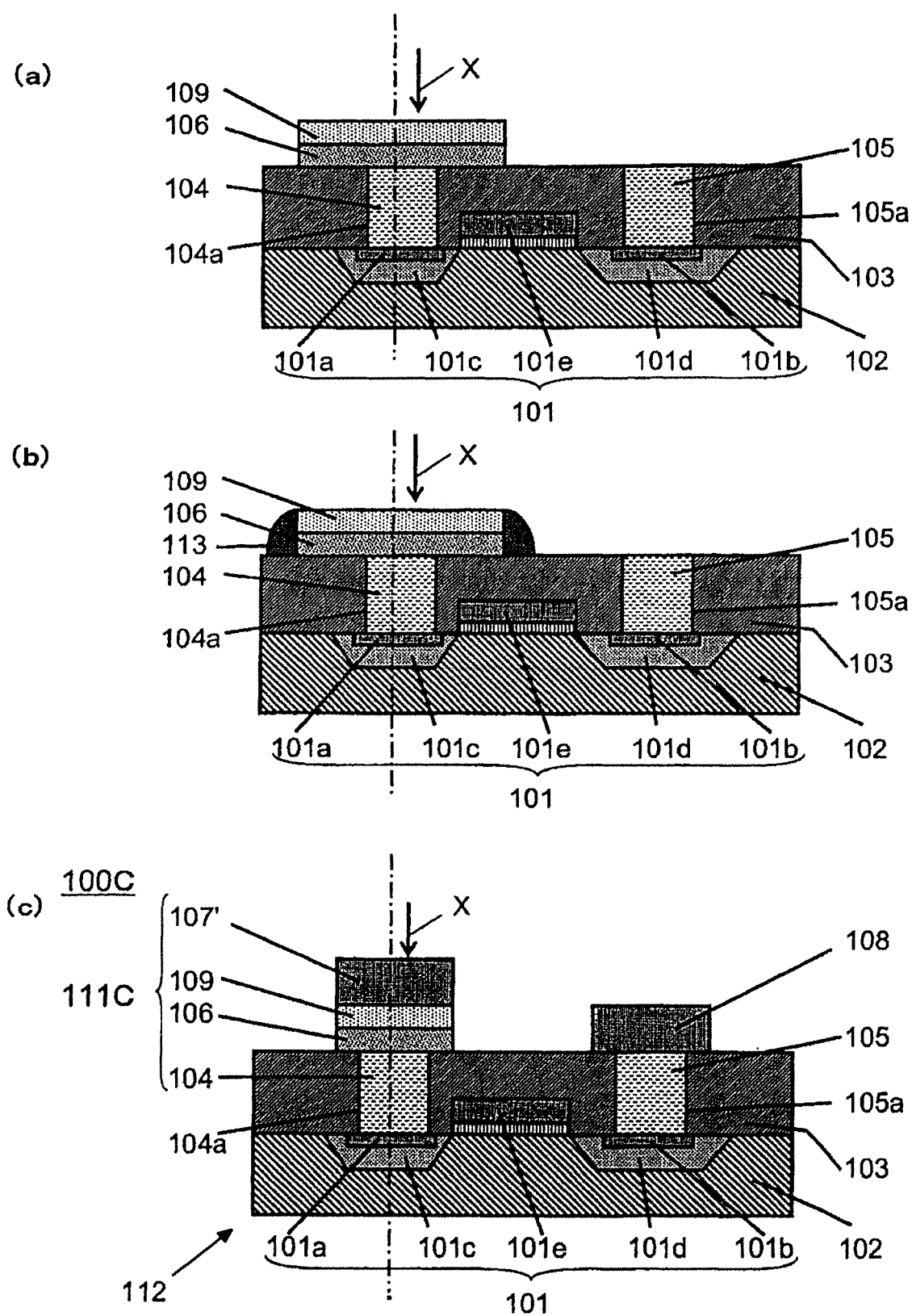
FIGS. 23(a) to 23(c) are cross-sectional views showing a manufacturing method of the nonvolatile semiconductor memory device 100C.
Figure 24:
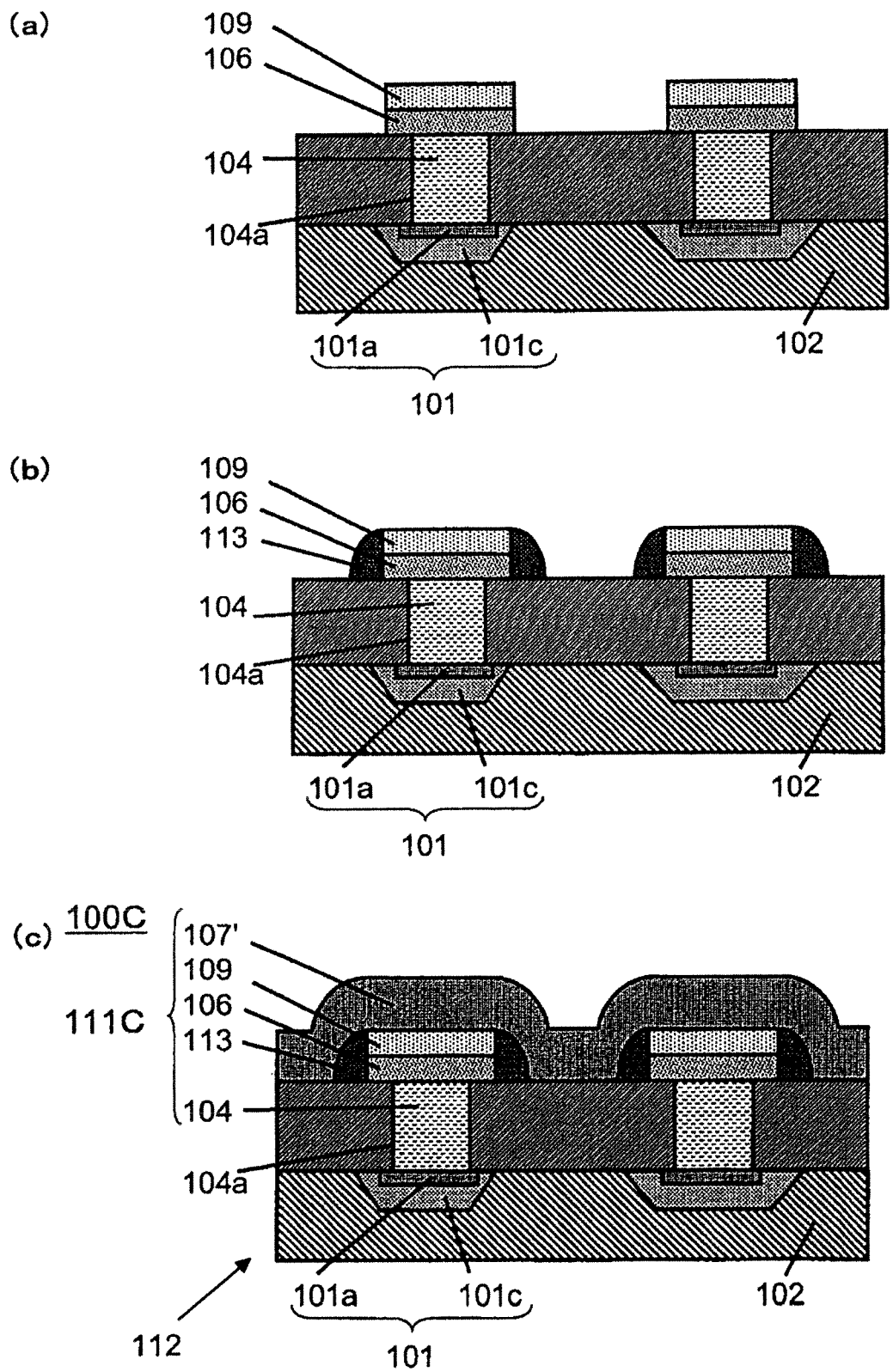
FIGS. 24(a) to 24(c) are cross-sectional views showing a manufacturing method of the nonvolatile semiconductor memory device 100C.

FIGS. 23(a) to 23(c) and FIGS. 24(a) to 24(c) are cross-sectional views showing a manufacturing method of the nonvolatile semiconductor memory device 100C. FIGS. 24(a), 24(b) and 24(c) are cross-sectional views taken along one-dotted lines of the cross-sectional views of FIGS. 23(a), 23(b) and 23(c), respectively.

The manufacturing method of the nonvolatile semiconductor memory device 100C of Embodiment 1 will be described. The steps before those shown in FIGS. 23(a) and 24(a) are identical to those of FIGS. 2(a) and 2(b) and therefore will not be described.

FIGS. 23(a) and 24(a) are views showing steps of forming the electrode layer 109 and the resistance variable layer 106. In this step, the resistance variable layer 106 and the electrode layer 109 are formed to cover entire opening of first contact hole 104a (cover entire upper end surface of the first contact plug 104).

FIGS. 23(b) and 24(b) are views showing a step of forming the side wall insulating layer 113. In this step, an insulating layer is formed over the entire upper surface of the interlayer insulating layer 103 to cover the entire electrode layer 109 and the entire resistance variable layer 106, and the entire surface of the insulating layer is etched back, thereby forming the side wall insulating layer 113 on the side walls at the steps formed by the electrode layer 109 and the resistance variable layer 106.

FIGS. 23(c) and 24(c) are views showing the step of forming the first wire 107' and the second wire 108. In this step, a step of forming the first wire 107' which is also used as a mask for covering a portion of the resistance variable layer 106, a portion of the electrode layer 109, and a portion of the side wall insulating layer 113 to remove a remaining portion of the resistance variable layer 106, a remaining portion of the electrode layer 109 and a remaining portion of the side wall insulating layer 113, and a step of covering a portion of the second contact plug 105 to form the second wire 108, is performed, thereby manufacturing the nonvolatile semiconductor memory device 100C.

The first wire 107' and the second wire 108 are formed in such a manner that a wire material is deposited over the entire upper surface of the interlayer insulating layer 103 to cover the resistance variable layer 106 and the electrode layer 109, a mask (photoresist or the like) having a predetermined shape is provided over the wire material, and then etching is conducted using the mask. In this case, the resistance variable layer 106 and the electrode layer 109 may be etched successively concurrently with the formation of the first wire 107.' Or, the photoresist may be removed after forming the first wire 107', and then the resistance variable layer 106 and the electrode layer 109 may be etched using the first wire 107' as a mask.

The first wire 107' and the second wire 108 may be formed simultaneously concurrently in the same step. In this case, the step for forming the first wire 107' is also the step for forming the second wire 108.

Since in the above manufacturing method, the level difference formed by the resistance variable layer 106 and the electrode layer 109 is lessened, the first wire 107' is less likely to be disconnected at the steps in a lithography step for forming the first wire 107' and the second wire 108. In addition, a variation in wire resistance of the first wire 107' can be reduced.

Figure 25:
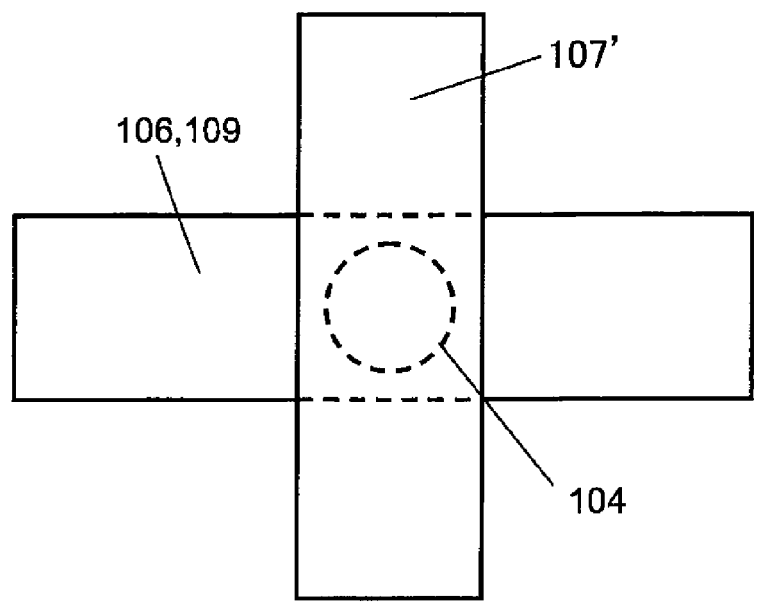
FIGS. 25(a) and FIG. 25(b) are plan views of enlarged major constituents of the nonvolatile memory device 100C which are viewed taken in the direction of arrow X of FIGS. 23(b) and 23(c), respectively.
Figure 25:
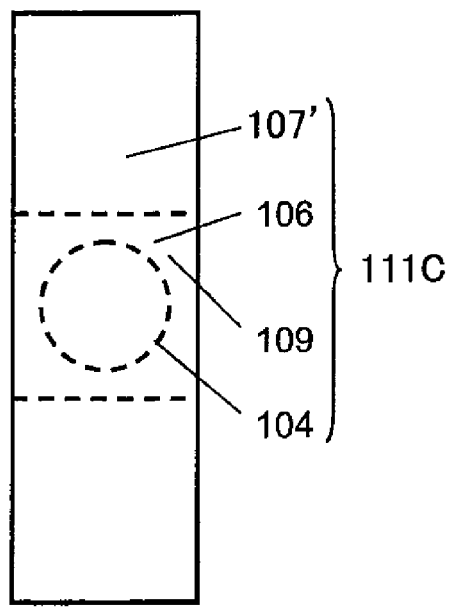

FIGS. 25(a) and FIG. 25(b) are plan views of enlarged major constituents of the nonvolatile memory device 100C which are viewed taken in the direction of arrow X of FIGS. 23(c) and 23(d), respectively.

FIG. 25(a) shows a state where the first wire 107' is formed on the resistance variable layer 106 and the electrode layer 109 in the configuration of FIG. 23(b) but a portion of the resistance variable layer 106 and a portion of the electrode layer 109 which protrude outward to the right and to the left are not removed yet.

As shown in FIG. 25(a), the first wire 107' of a rectangular shape (strip shape or line shape) is formed on the resistance variable layer 106 and the electrode layer 109 of a rectangular shape covering the first contact plug 104 such that the first wire 107' crosses the resistance variable layer 106 and the electrode layer 109 perpendicularly to the resistance variable layer 106 and the electrode layer 109. The first wire 107' comprises a conductive material such as Al. By using the first wire 107' as a mask, an unnecessary portion of the resistance variable layer 106 and an unnecessary portion of the electrode layer 109 are removed, thereby manufacturing the resistance variable element 111C having a miniaturized structure as shown in FIG. 25(b).

Embodiment 2

Figure 4:
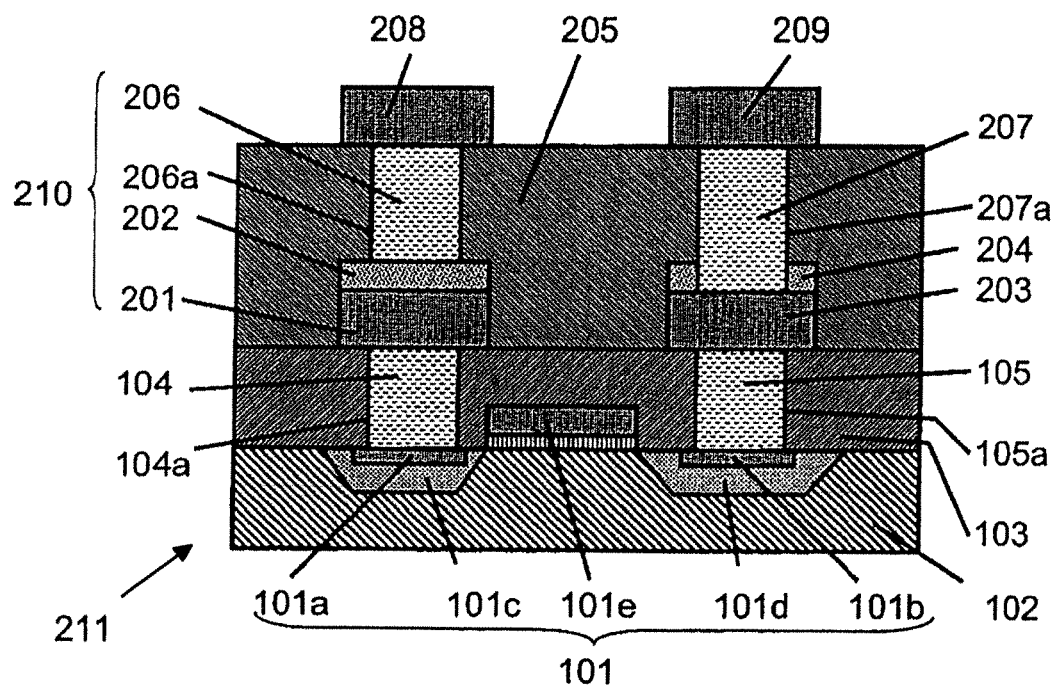
FIG. 4 is a cross-sectional view showing an exemplary configuration of a nonvolatile semiconductor memory device according to Embodiment 2 of the present invention.

FIG. 4 is a cross-sectional view showing an exemplary configuration of a nonvolatile semiconductor memory device 200 according to Embodiment 2 of the present invention.

As shown in FIG. 4, the nonvolatile semiconductor memory device 200 of Embodiment 2 includes a substrate 102 provided with a transistor 101, a first interlayer insulating layer 103 formed on the substrate 102 to cover the transistor 101, a first contact plug 104 penetrating the first interlayer insulating layer 103 and electrically connected to either a drain electrode 101a or a source electrode 101b of the transistor 101, and a second contact plug 105 penetrating the first interlayer insulating layer 103 and electrically connected to the other of the drain electrode 101a or the source electrode 101b of the transistor 101. The nonvolatile semiconductor memory device 200 further includes a first wire 201 covering a portion of the first contact plug 104, a first resistance variable layer 202 formed on the first wire 201 to have the same shape as the first wire 201, a second wire 203 covering a portion of a second contact plug 105, a second resistance variable layer 204 formed on the second wire 203 to have the same shape as the second wire 203, and a second interlayer insulating layer 205 formed over the first interlayer insulating layer 103 to cover the first wire 201 and the second wire 203. The nonvolatile semiconductor memory device 200 includes a third contact plug 206 formed on the first resistance variable layer 202 to penetrate the second interlayer insulating layer 205, a fourth contact plug 207 formed on the second wire 203 to penetrate the second interlayer insulating layer 205 and the second resistance variable layer 204, a third wire 208 formed on the second interlayer insulating layer 205 to cover the third contact plug 206, and a fourth wire 209 formed on the second interlayer insulating layer 205 to cover the fourth contact plug 207.

In this configuration, a resistance variable element 210 includes the first wire 201 which is the lower electrode, the first resistance variable layer 202 and the third contact plug 206 which is the upper electrode.

In such a configuration, a 1T1R-type memory cell 211 is formed, and the lower electrode of the resistance variable element 210 and the first wire 201 are constituted by an identical constituent, while the upper electrode of the resistance variable element 210 and the third contact plug 206 are constituted by an identical constituent, thereby resulting in a simplified and miniaturized structure of the memory cell 211.

Since the nonvolatile semiconductor memory device 200 of Embodiment 2 operates similarly to the nonvolatile semiconductor memory device 100 described in Embodiment 1, the operation example will not be described repetitively.

FIGS. 5(a) to 5(c) and FIGS. 6(a) and 6(b) are cross-sectional views showing a manufacturing method of the nonvolatile semiconductor memory device 200 according to Embodiment 2. The manufacturing method of the nonvolatile semiconductor memory device 200 of Embodiment 2 will be described with reference to FIGS. 5(a) to 5(c) and FIGS. 6(a) and 6(b).

Figure 5:
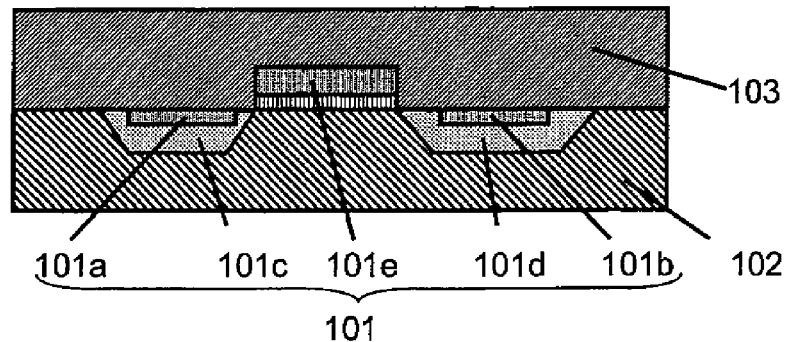
FIGS. 5(a) to 5(c) are cross-sectional views showing a manufacturing method of the nonvolatile semiconductor memory device according to Embodiment 2 of the present invention.
Figure 5:
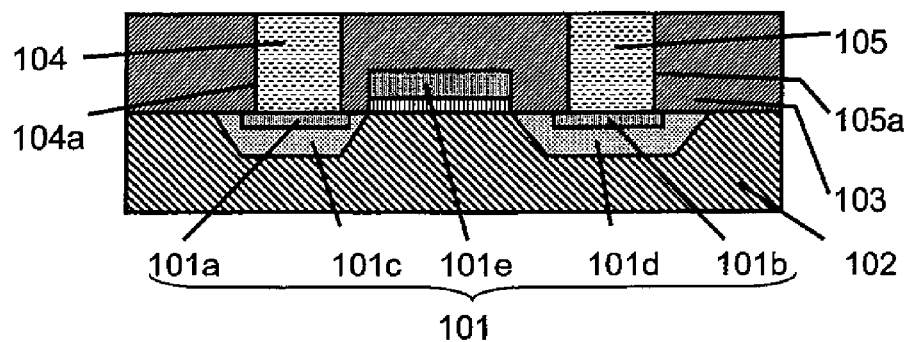
Figure 5:
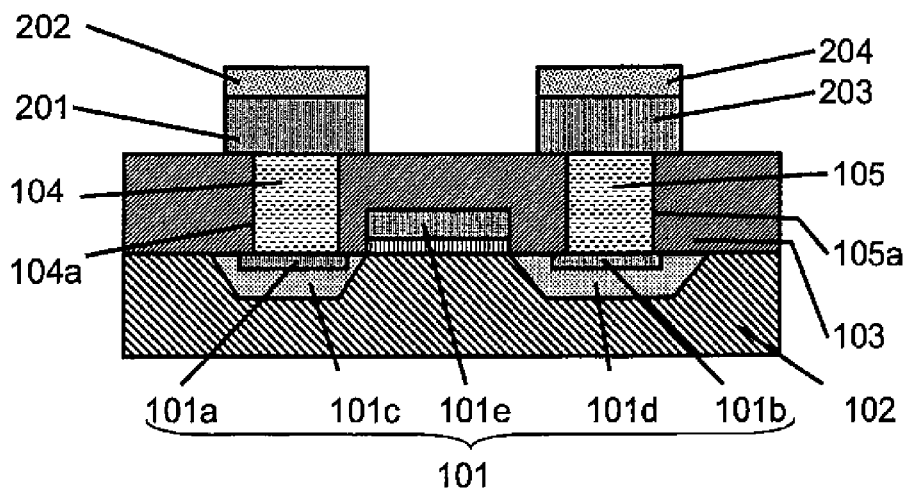
Figure 6:
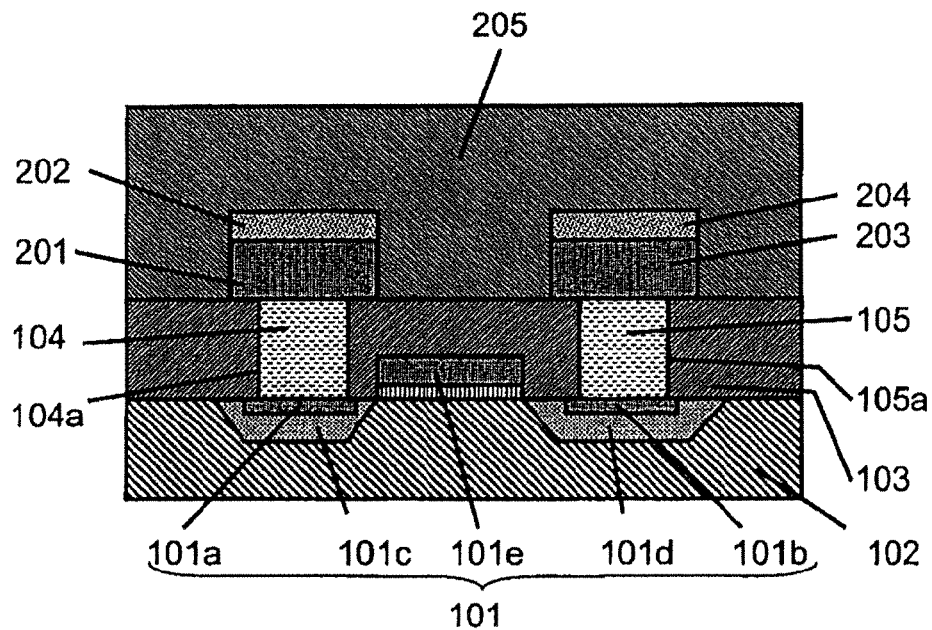
FIGS. 6(a) and 6(b) are cross-sectional views showing a manufacturing method of the nonvolatile semiconductor memory device according to Embodiment 2 of the present invention.
Figure 6:
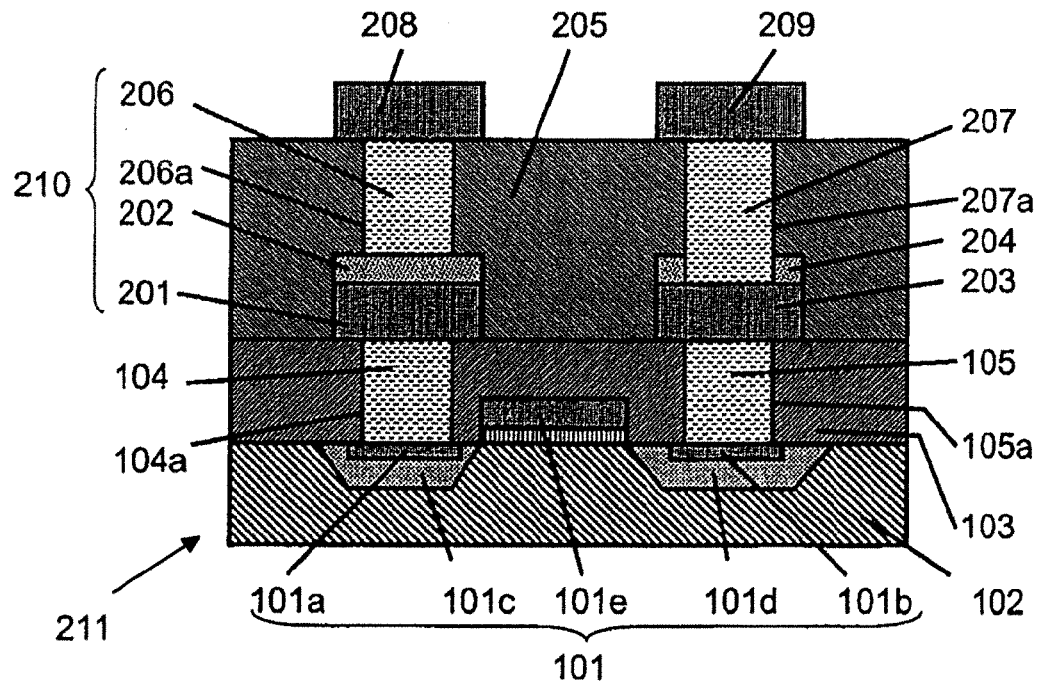

As shown in FIGS. 5 and 6, the manufacturing method of Embodiment 2 includes a step of forming the first interlayer insulating layer 103 over the substrate 102 provided with the transistor 101, a step of forming the first contact plug 104 and the second contact plug 105, a step of forming the first wire layer and the resistance variable layer, a step of forming the first wire 201, the second wire 203, the first resistance variable layer 202 and the second resistance variable layer 204 such that the first resistance variable layer 202 has the same shape as the first wire 201 and the second resistance variable layer 204 has the same shape as the second wire 203, a step of forming the second interlayer insulating layer 205, a step of forming the third contact plug 206, a step of forming the fourth contact plug 207 and a step of forming the third wire 208 and the fourth wire 209.

Initially, as shown in FIG. 5(a), in the step of forming the first interlayer insulating layer 103, the first interlayer insulating layer 103 is formed over the substrate 102 to cover the transistor 101.

Then, as shown in FIG. 5(b), in the step of forming the first contact plug 104 and the second contact plug 105, a first contact hole 104a is formed on either a drain electrode 101a or a source electrode 101b of the transistor 101 to penetrate the first interlayer insulating layer 103, a second contact hole 105a is formed on the other of the drain electrode 101a or the source electrode 101b of the transistor 101 to penetrate the first interlayer insulating layer 103, and a conductor is filled into the first contact hole 104a and the second contact hole 105a to form the first contact plug 104 and the second contact plug 105, respectively.

As shown in FIG. 5(c), in the step of forming the first wire layer and the resistance variable layer, thin layers which will become the first wire layer and the resistance variable layer are deposited over the first interlayer insulating layer 103 to cover the first contact plug 104 and the second contact plug 105. Then, in the step of forming the first wire 201, the second wire 203, the first resistance variable layer 202 and the second resistance variable layer 204 such that the first resistance variable layer 202 has the same shape as the first wire 201 and the second resistance variable layer 204 has the same shape as the second wire 203, the first wire 201 and the first resistance variable layer 202 are formed on the first contact plug 104 and the second wire 203 and the second resistance variable layer 204 are formed on the second contact plug 105 such that the first wire 201 and the first resistance variable layer 202 are isolated from the second wire 203 and the second resistance variable layer 204.

Then, as shown in FIG. 6(a), in the step of forming the second interlayer insulating layer 205, the second interlayer insulating layer 205 is formed over the first interlayer insulating layer 103 to cover the first wire 201, the first resistance variable layer 202, the second wire 203 and the second resistance variable layer 204.

FIG. 6(b) shows a step of forming the third contact plug 206, a step of forming the fourth contact plug 207, and a step of forming the third wire 208 and the fourth wire 209. A third contact hole 206a is formed on the first resistance variable layer 202 to penetrate the second interlayer insulating layer 205. A fourth contact hole 207a is formed on the second wire 203 to penetrate the second interlayer insulating layer 205 and the second resistance variable layer 204. A hole penetrating a part of the second resistance variable layer 204 is formed in such a manner that the fourth contact hole 207a is formed to reach the second resistance variable layer 204 concurrently with the formation of the third contact hole 206a reaching the first resistance variable layer 202, and then the hole is formed using the fourth contact hole 207a as an open mask.

Then, a conductor material is filled into the third contact hole 206a to form the third contact plug 206, and into the fourth contact hole 207a, to form the fourth contact plug 207.

The third wire 208 is formed on the second interlayer insulating layer 205 to cover the third contact plug 206, and the fourth wire 209 is formed on the second interlayer insulating layer 205 to cover the fourth contact plug 207 such that the third wire 208 is isolated from the fourth wire 209.

In such a method, the nonvolatile semiconductor memory device 200 is manufactured to include a 1T1R memory cell 211 including the resistance variable element 210 and the transistor 101. In this case, the first wire 201 which is a wire of the memory cell 211, and the second wire 203 which is also used as a wire connected with a memory driving section or a peripheral circuit can be formed concurrently in the same step, which results in simplified process steps.

The resistance variable element 210 includes the first wire 201 which is the lower electrode, the third contact plug 206 which is the upper electrode, and the first resistance variable layer 202 sandwiched between the first wire 201 and the third contact plug 206. Thus, the memory cell 211 has a simplified and miniaturized structure.

Further, since the resistance variable layer can be formed by adding only one mask for forming a hole to a standard Si semiconductor process, the number of process steps does not increase. This enables high-dense integration, higher speed, and lower electric power consumption. In addition, the manufacturing process steps are simplified and as a result, a manufacturing time period and a manufacturing cost can be reduced.

Alternatively, by setting the size of the fourth contact hole 207a larger than the size of the third contact hole 206a, the third contact hole 206a and the fourth contact hole 207a which are different in depth can be formed concurrently, by making use of a feature of a hole etching that an etching rate is higher as the size is larger. In this case, it is possible to implement a nonvolatile semiconductor memory device at a lower process cost without adding any masks.

The first resistance variable layer 202 may comprise a material including at least tantalum oxide.

In such a configuration, it is possible to implement a manufacturing process which provides a reversible and stable rewrite characteristic and a good resistance value retention characteristic as well as high-speed operability and is highly compatible with the standard Si semiconductor process.

Although in the exemplary configuration of the nonvolatile semiconductor memory device 200 of Embodiment 2 of the present invention, the first contact plug 104 is directly connected to the drain electrode 101*a* of the transistors, and the second contact plug 105 is directly connected to the source electrode 101*b* of the transistors, respectively, wires, contact plugs or the like may intervene between the first contact plug 104 and the drain electrode 101*b* and between the second contact plug 105 and the source electrode 101*b* so long as electric connection is formed between them.

Embodiment 3

Figure 7:
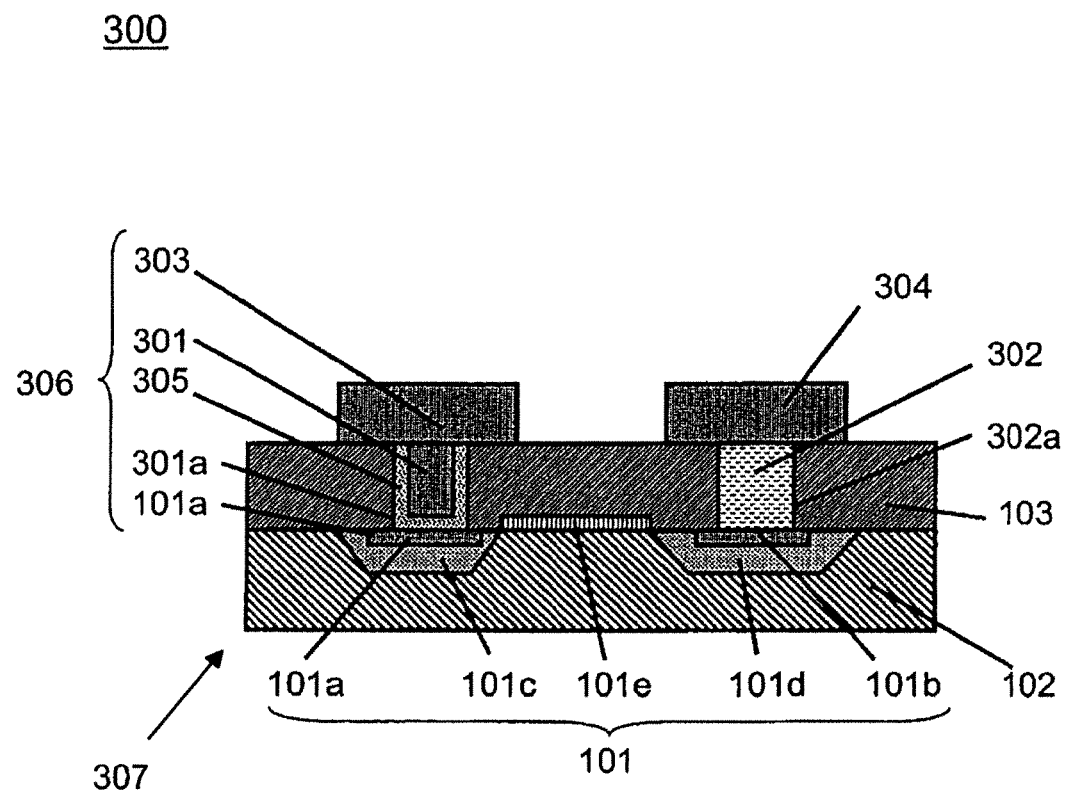
FIG. 7 is a cross-sectional view showing an exemplary configuration of a nonvolatile semiconductor memory device according to Embodiment 3 of the present invention.

FIG. 7 is a cross-sectional view showing an exemplary configuration of a nonvolatile semiconductor memory device 300 according to Embodiment 3 of the present invention.

As shown in FIG. 7, the nonvolatile semiconductor memory device 300 of Embodiment 3 includes a substrate 102 provided with a transistor 101, a first interlayer insulating layer 103 formed on the substrate 102 to cover the transistor 101, a first contact plug 301 penetrating the first interlayer insulating layer 103 and electrically connected to either a drain electrode 101*a* or a source electrode 101*b* of the transistor 101, and second contact plug 302 penetrating the first interlayer insulating layer 103 and electrically connected to the other of the drain electrode 101*a* or the source electrode 101*b* of the transistor 101. The nonvolatile semiconductor memory device 300 includes first wire 303 covering a portion of the first contact plug 301, second wire 304 covering a portion of the second contact plug 302, and resistance variable layer 305 formed on a bottom portion and a side wall inside the first contact hole 301*a* such that the resistance variable layer 305 is sandwiched between the first contact plug 301, and the first interlayer insulating layer 103 and the drain electrode 101*a* or between the first contact plug 301, and the first interlayer insulating layer 103 and the source electrode 101*b*.

In such a configuration, the nonvolatile semiconductor memory device 300 is manufactured to include a 1T1R-type memory cell 307 including the resistance variable element 306 and the transistor 101. In this case, since the first wire 303 which is the wire of the memory cell 307 and the second wire 304 which may also be used as the wire connected with the memory driving section or the peripheral circuit can be formed concurrently in the same step, the process steps are simplified.

A resistance variable element 306 includes the drain electrode 101*a* which is the lower electrode, the first contact plug 301 and the first wire 303 which are the upper electrode, and the resistance variable layer 305 sandwiched between the drain electrode 101*a*, and the first contact plug 301 and the first wire 303 Thus, the memory cell 307 has a simplified and miniaturized structure. Since the bottom portion of the resistance variable layer 305 is not exposed during processes such as CMP or dry etching, plasma damage, damage caused by gases or slurry, influence of reduction, etc. with respect to the resistance variable layer 305 can be surely prevented. The resistance variable layer 305, which is formed to be miniaturized and integrated in contact with the bottom portion and the side wall inside the first contact hole 301*a*, can be formed by adding only one mask to the standard Si semiconductor process. Therefore, the number of the manufacturing process steps of the nonvolatile semiconductor memory device 300 does not increase. This enables the nonvolatile semiconductor memory device 300 to achieve further miniaturization, high-dense integration, higher speed, and lower electric power consumption. In addition, the manufacturing process steps are simplified and as a result, a manufacturing time period and a manufacturing cost can be reduced.

Since the nonvolatile semiconductor memory device 300 of Embodiment 3 operates similarly to the nonvolatile semiconductor memory device 100 described in Embodiment 1, the operation example will not be described repetitively.

Figure 8:
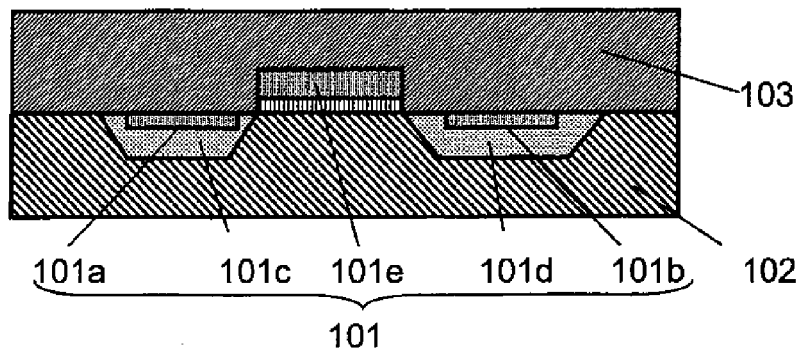
FIGS. 8(a) to 8(c) are cross-sectional views showing a manufacturing method of the nonvolatile semiconductor memory device according to Embodiment 3 of the present invention.
Figure 8:
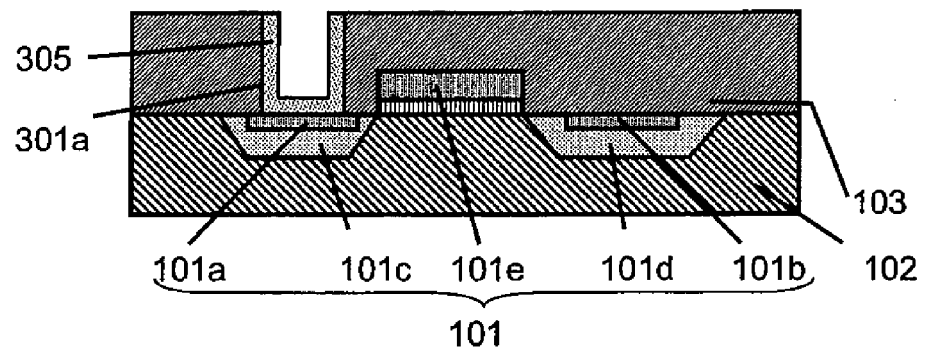
Figure 8:
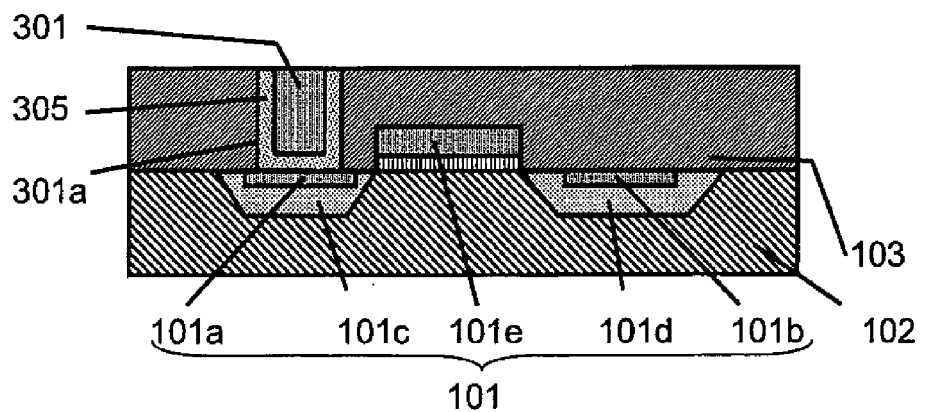
Figure 9:
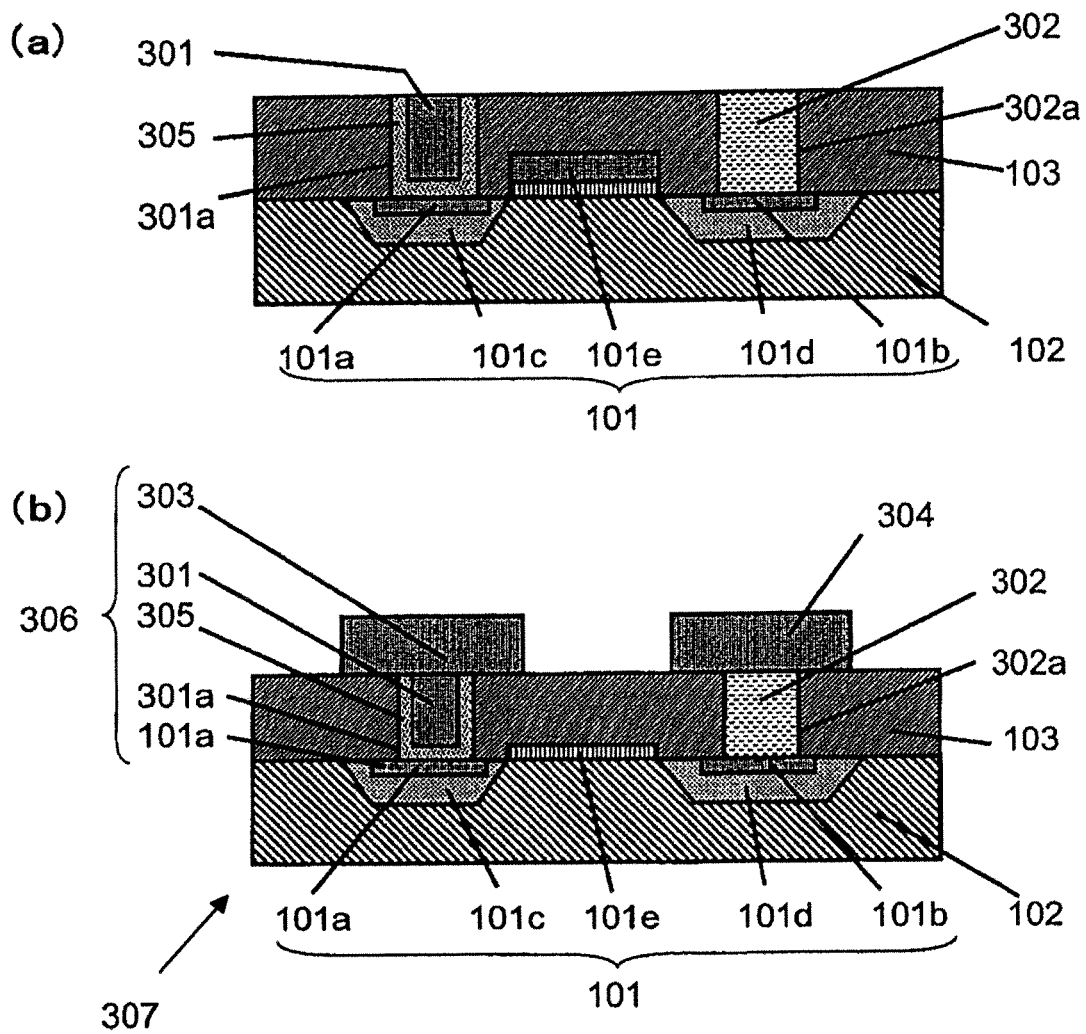
FIGS. 9(a) and FIG. 9(b) are cross-sectional views showing a manufacturing method of the nonvolatile semiconductor memory device according to Embodiment 3 of the present invention.

FIGS. 8(*a*) to 8(*c*) and FIGS. 9(*a*) and 9(*b*) are cross-sectional views showing a manufacturing method of the nonvolatile semiconductor memory device 300 according to Embodiment 3. The manufacturing method of the nonvolatile semiconductor memory device 300 of Embodiment 3 will be described with reference to FIGS. 8(*a*) to 8(*c*) and FIGS. 9(*a*) and 9(*b*).

As shown in FIGS. 8 and 9, the manufacturing method of Embodiment 3 includes a step of forming the first interlayer insulating layer 103 over the substrate 102 provided with the transistor 101, a step of forming the resistance variable layer 305 and the first contact plug 301 inside the first contact hole, a step of forming the second contact plug 302, and a step of forming the first wire layer 303 and the second wire 304.

Initially, as shown in FIG. 8(*a*), initially, in the step of forming the first interlayer insulating layer 103, the first interlayer insulating layer 103 is formed over the substrate 102 to cover the transistor 101.

Then, as shown in FIG. 8(*b*), in the step of forming the first resistance variable layer 305, first contact hole 301*a* is formed on the drain electrode 101*a* of the transistor 101 to penetrate the first interlayer insulating layer 103, then a resistance variable layer is deposited over the entire surface, and a portion of the resistance variable layer on the first interlayer insulating layer 103 is removed by CMP or etching, thereby forming the resistance variable layer 305 on a bottom portion and a side wall of the first contact hole 301*a*.

Then, as shown in FIG. 8(*c*), in the step of forming the first contact plug 301, a conductor is filled into inside the first contact hole 301*a* and the resistance variable layer 305, to form the first contact plug 301.

Then, as shown in FIG. 9(*a*), in the step of forming the second contact plug 302, the first contact hole 302*a* is formed on the source electrode 101*b* of the transistor 101 to penetrate the first interlayer insulating layer 103, and a conductor is filled into the first contact hole 302*a*, to form the second contact plug 302.

FIG. 9(*b*) shows a step of forming the first wire 303 and the second wire 304. The first wire 303 is formed to cover a portion of the resistance variable layer 305 and a portion of the first contact plug 301, and the second wire 304 are formed to cover a portion of the second contact plug 302 such that the first wire 303 is isolated from the second wire 304.

In such a method, a 1T1R-type memory cell is formed, and the lower electrode of the resistance variable element and the drain electrode 101*a* are constituted by an identical constituent, while the upper electrode of each of the resistance variable elements is identical in constituent to the first wire 303 and the first contact plug 301, thereby resulting in a simplified and miniaturized structure of the memory cells. Since the resistance variable layer can be formed by adding only one mask to the standard Si semiconductor process, it is possible to implement a nonvolatile semiconductor memory device which does not increase the number of process steps and can reduce a process cost.

The resistance variable element 306 includes the drain electrode 101a which is the lower electrode, the first wire 303 and the first contact plug 301 which are the upper electrode, and the resistance variable layer 305 sandwiched between the drain electrode 101a, and the first wire 303 and the first contact plug 301. Thus, the memory cell 307 has a simplified and miniaturized structure. Since the resistance variable layer can be formed by adding only one mask to the standard Si semiconductor process, the number of process steps does not increase. This enables the nonvolatile semiconductor memory device 300 to achieve further miniaturization, high-dense integration, higher speed, and lower electric power consumption. In addition, the manufacturing process steps can be simplified, and a manufacturing time period and a manufacturing cost can be reduced.

The resistance variable layer 305 may comprise a material including at least tantalum oxide.

In such a configuration, it is possible to implement a manufacturing process which provides a reversible and stable rewrite characteristic and a good resistance value retention characteristic as well as high-speed operability and is highly compatible with the standard Si semiconductor process.

Although in the exemplary configuration of the nonvolatile semiconductor memory device 300 of Embodiment 3 of the present invention, the resistance variable layer 305 is directly connected to the drain electrode 101a of the transistor, and the second contact plug 302 is directly connected to the source electrode 101b of the transistor, wires, contact plugs or the like may intervene between the resistance variable layer 305 and the drain electrode 101a and between the second contact plug 302 and the source electrode 101b so long as electric connection is formed between them.

Embodiment 4

Figure 10:
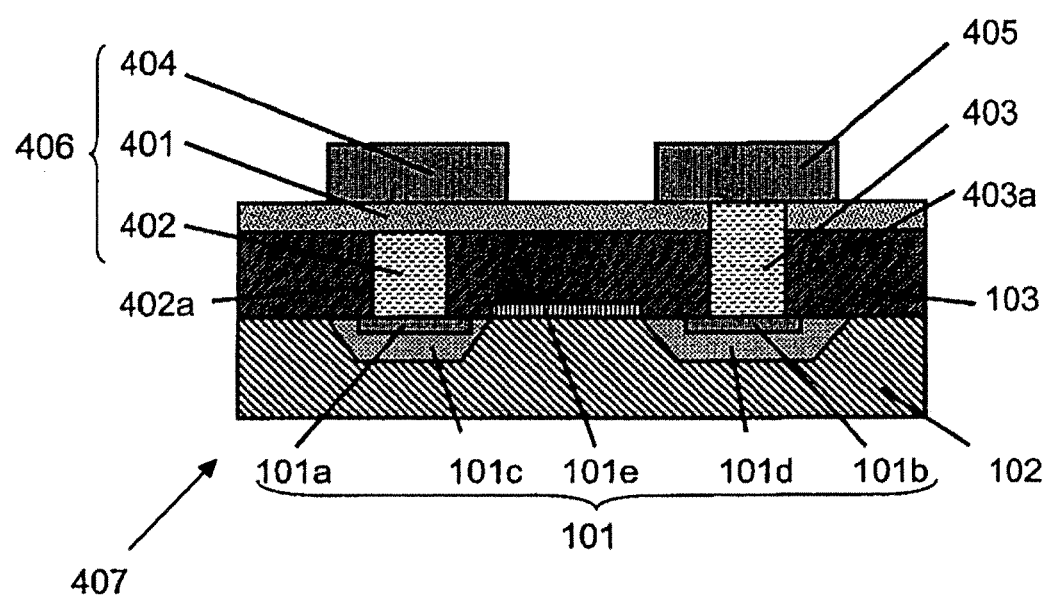
FIG. 10 is a cross-sectional view showing an exemplary configuration of a nonvolatile semiconductor memory device according to Embodiment 4 of the present invention.

FIG. 10 is a cross-sectional view showing an exemplary configuration of a nonvolatile semiconductor memory device 400 according to Embodiment 4 of the present invention.

As shown in FIG. 10, the nonvolatile semiconductor memory device 400 of Embodiment 4 includes a substrate 102 provided with a transistor 101, a first interlayer insulating layer 103 formed on the substrate 102 to cover the transistor 101, a resistance variable layer 401 formed over the first interlayer insulating layer 103, and a first contact plug 402 penetrating the first interlayer insulating layer 103 and electrically connected to either a drain electrode 101a or the source electrode 101b of the transistor 101. The nonvolatile semiconductor memory device 400 includes a second contact plug 403 penetrating the first interlayer insulating layer 103 and the resistance variable layer 401 and electrically connected to the other of the source electrode 101b or the drain electrode 101a of the transistor 101, a first wire 404 covering a portion of the resistance variable layer 401 on the first contact plug 402 and second wire 405 covering a portion of the second contact plug 403.

In this example, the second contact plug 403 penetrate the resistance variable layer 401 and the first interlayer insulating layer 103, and is connected to the second wire 405.

But, after the first contact plug 402 and the second contact plug 403 are formed, the resistance variable layer 401 is formed on the first interlayer insulating layer 103 to cover the first contact plug 402 and the second contact plug 403, and a portion of the resistance variable layer 401 on the second contact plug 403 are removed to form through-hole in the resistance variable layer 401. Then, a plug electrode material is filled into the through-hole and planarized, and then the first wire 404 and the second wire 405 are formed on the planarized surface such that the first wire 404 is isolated from the second wire 405, thereby manufacturing the nonvolatile semiconductor memory device 400.

In the nonvolatile semiconductor memory device 400 of FIG. 10, the resistance variable element 406 includes the first wire 404 which is the upper electrode, the first contact plug 402 which is the lower electrode, and the resistance variable layer 401 sandwiched between the upper electrode and the lower electrode. The memory cell 407 has 1T1R structure consisting of the resistance variable element 406 and the transistor 101.

In such a configuration, the lower electrode of the resistance variable element 406 and the first contact plug 402 are constituted by an identical constituent and the upper electrode of the resistance variable element 406 and the first wire 404 are constituted by an identical constituent, thereby allowing the memory cell 407 to have a simplified and miniaturized structure. The resistance variable element 406 is formed in a region where the first contact plug 402 does not penetrate the resistance variable layer 401. Since the resistance variable layer 401 is formed on a flat portion, it is sufficient that only a variation at the time of layer forming is taken into account, and a variation in cell resistances can be reduced. Since a portion of the resistance variable layer which is in the vicinity of the resistance variable element is not exposed during processes such as CMP or dry etching, plasma damage, damage caused by gases or slurry, influence of reduction, etc. with respect to the resistance variable layers. 401 can be surely prevented. Further, since the resistance variable layer 401 can be formed by adding only one mask to a standard Si semiconductor process, it is possible to implement the nonvolatile semiconductor memory device 400 which does not increase the number of process steps and can reduce a process cost.

This enables the nonvolatile semiconductor memory device 400 to achieve miniaturization, high-dense integration, higher speed, and lower electric power consumption. In addition, the manufacturing process steps are simplified and as a result, a manufacturing time period and a manufacturing cost can be reduced.

Since the nonvolatile semiconductor memory device 400 of Embodiment 4 operates similarly to the nonvolatile semiconductor memory device 100 described in Embodiment 1, the operation example will not be described repetitively.

FIGS. 11(a) to 11(c) and FIGS. 12(a) and 12(b) are cross-sectional views showing a manufacturing method of the nonvolatile semiconductor memory device 400 according to Embodiment 4. The manufacturing method of the nonvolatile semiconductor memory device 400 of Embodiment 4 will be described with reference to FIGS. 11(a) to 11(c) and FIGS. 12(a) and 12(b).

Figure 11:
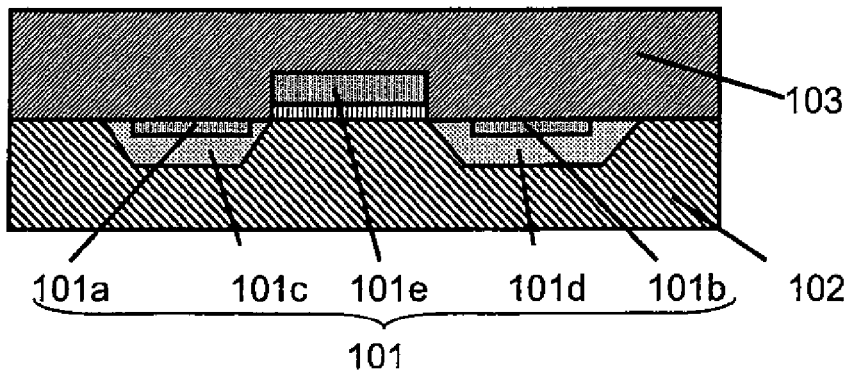
FIGS. 11(a) to FIG. 11(c) are cross-sectional views showing a manufacturing method of the nonvolatile semiconductor memory device according to Embodiment 4 of the present invention.
Figure 11:
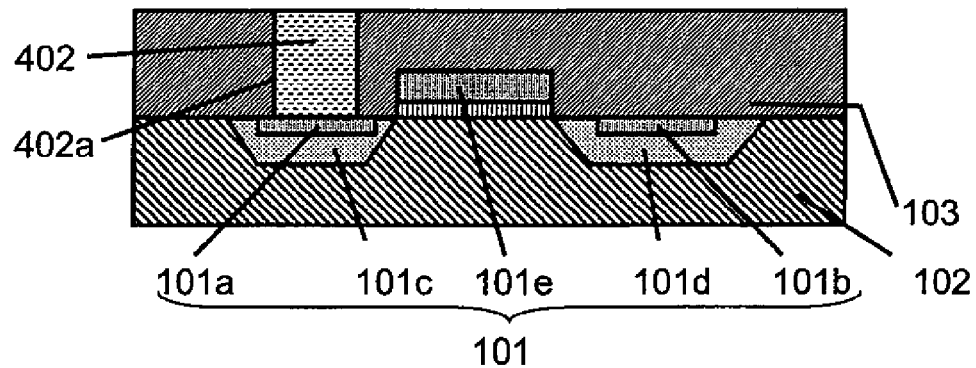
Figure 11:
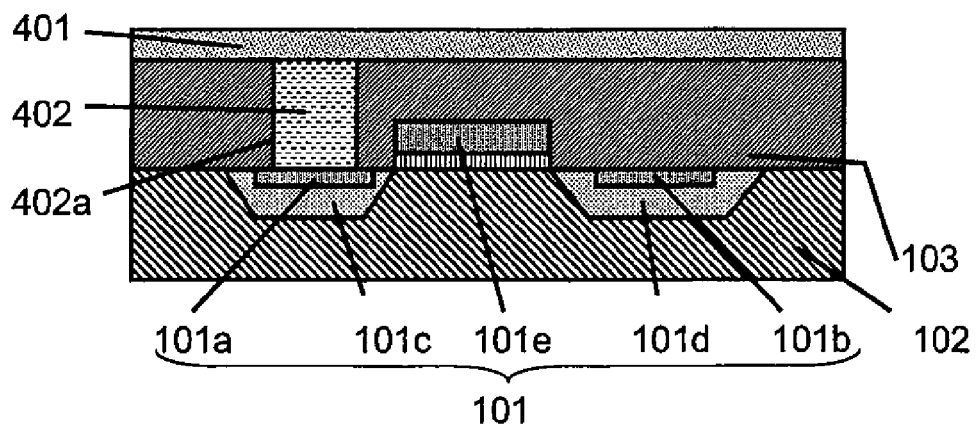
Figure 12:
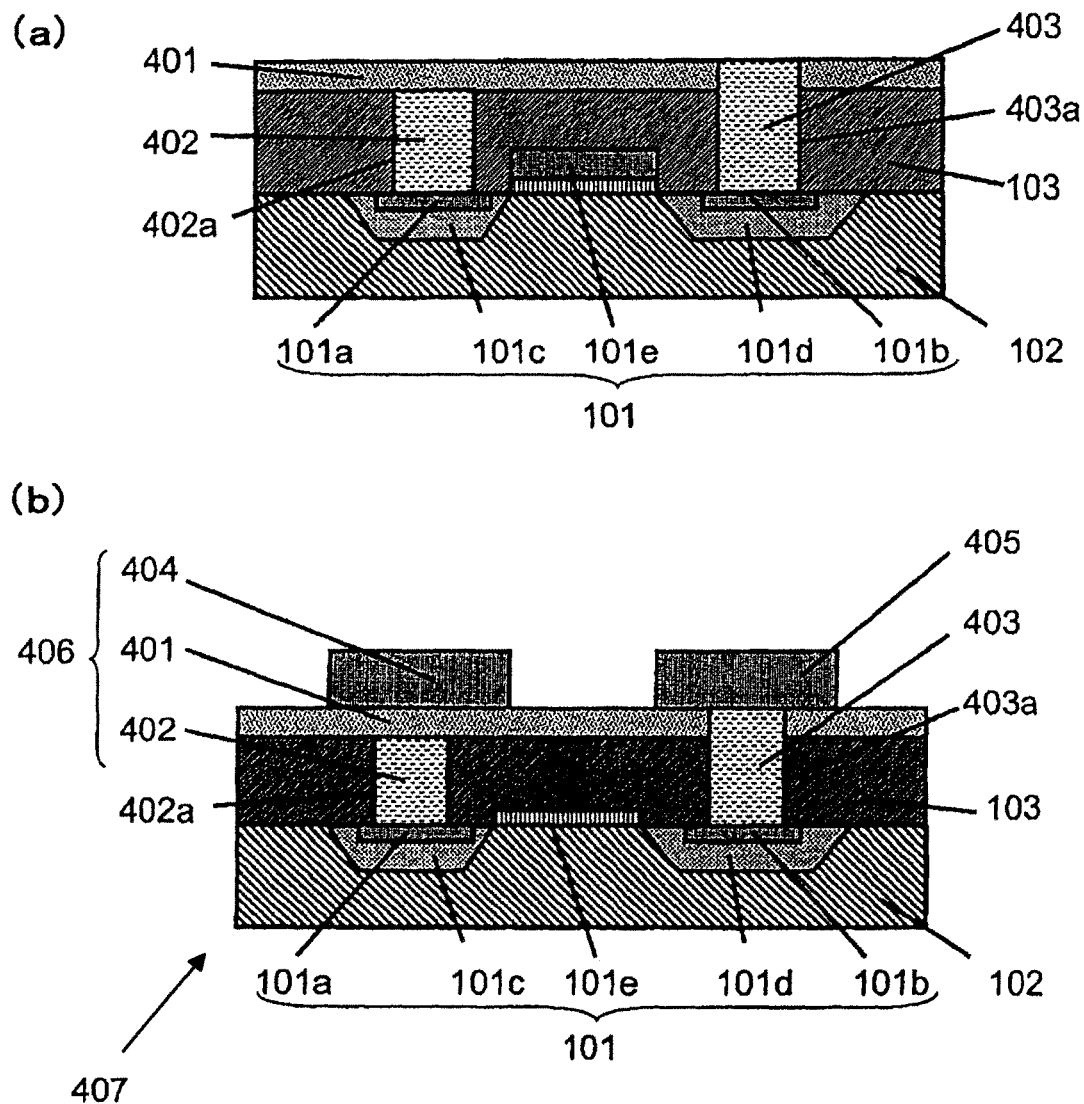
FIGS. 12(a) and FIG. 12(b) are cross-sectional views showing a manufacturing method of the nonvolatile semiconductor memory device according to Embodiment 4 of the present invention.

As shown in FIGS. 11 and 12, the manufacturing method of Embodiment 4 includes a step of forming the first interlayer insulating layer 103 over the substrate 102 provided with the transistor 101, a step of forming the first contact plug 402, a step of forming the resistance variable layer 401, a step of forming the second contact plug 403, and a step of forming the first wire layer 404 and the second wire layer 405.

Initially, as shown in FIG. 11(a), in the step of forming the first interlayer insulating layer 103, the first interlayer insulating layer 103 is formed over the substrate 102 to cover the transistor 101.

Then, as shown in FIG. 11(b), in the step of forming the first contact plug 402, first contact hole 402a is formed on the drain electrode 101a of the transistor 101 to penetrate the first interlayer insulating layer 103, and then a conductor is filled into the first contact hole 402a, to form the first contact plug 402.

Then, as shown in FIG. 11(c), in the step of forming the resistance variable layer 401, the resistance variable layer 401 are deposited on the first interlayer insulating layer 103 to cover the first contact plug 402.

Then, as shown in FIG. 12(a), in the step of forming the second contact plug 403, second contact hole 403a is formed on the source electrode 101b of the transistor 101 to penetrate the resistance variable layers 401 and the first interlayer insulating layer 103, and then a conductor is filled into the second contact hole 403a, to form the second contact plug 403.

FIG. 12(b) shows a step of forming the first wire 404 and the second wire 405. The first wire 404 is formed to cover a portion of the first contact plug 402, and the second wire 405 is formed to cover a portion of the second contact plug 403 such that the first wire 404 is isolated from the second wire 405.

In such a method, the nonvolatile semiconductor memory device 400 is manufactured to include the 1T1R-type memory cell 407 including the resistance variable element 406 and the transistor 101. The resistance variable element 407 includes the first contact plug 402 which is the lower electrode, the first wire 404 which is the upper electrode, and the resistance variable layer 401 sandwiched between the first contact plug 402 and the first wire 404, thereby allowing the memory cell 407 to have a simplified and miniaturized structure. Since the resistance variable layer can be formed by adding only one mask to the standard Si semiconductor process, the number of process steps does not increase. This enables the nonvolatile semiconductor memory device 400 to achieve further miniaturization, high-dense integration, higher speed, and lower electric power consumption. In addition, the manufacturing process steps can be simplified, and a manufacturing time period and a manufacturing cost can be reduced.

The first resistance variable layer 401 may comprise a material including at least tantalum oxide.

In such a configuration, it is possible to implement a manufacturing process which provides a reversible and stable rewrite characteristic and a good resistance value retention characteristic as well as high-speed operability and is highly compatible with the standard Si semiconductor process.

Although in the exemplary configuration of the nonvolatile semiconductor memory device 400 of Embodiment 4 of the present invention, the first contact plug 402 is directly connected to the drain electrode 101a of the transistor, and the second contact plug 403 is directly connected to the source electrode 101b of the transistor, wires, contact plugs or the like may intervene between the first contact plug 402 and the drain electrode 101a and between the second contact plug 403 and the source electrode 101b so long as electric connection is formed between them.

Embodiment 5

Figure 13:
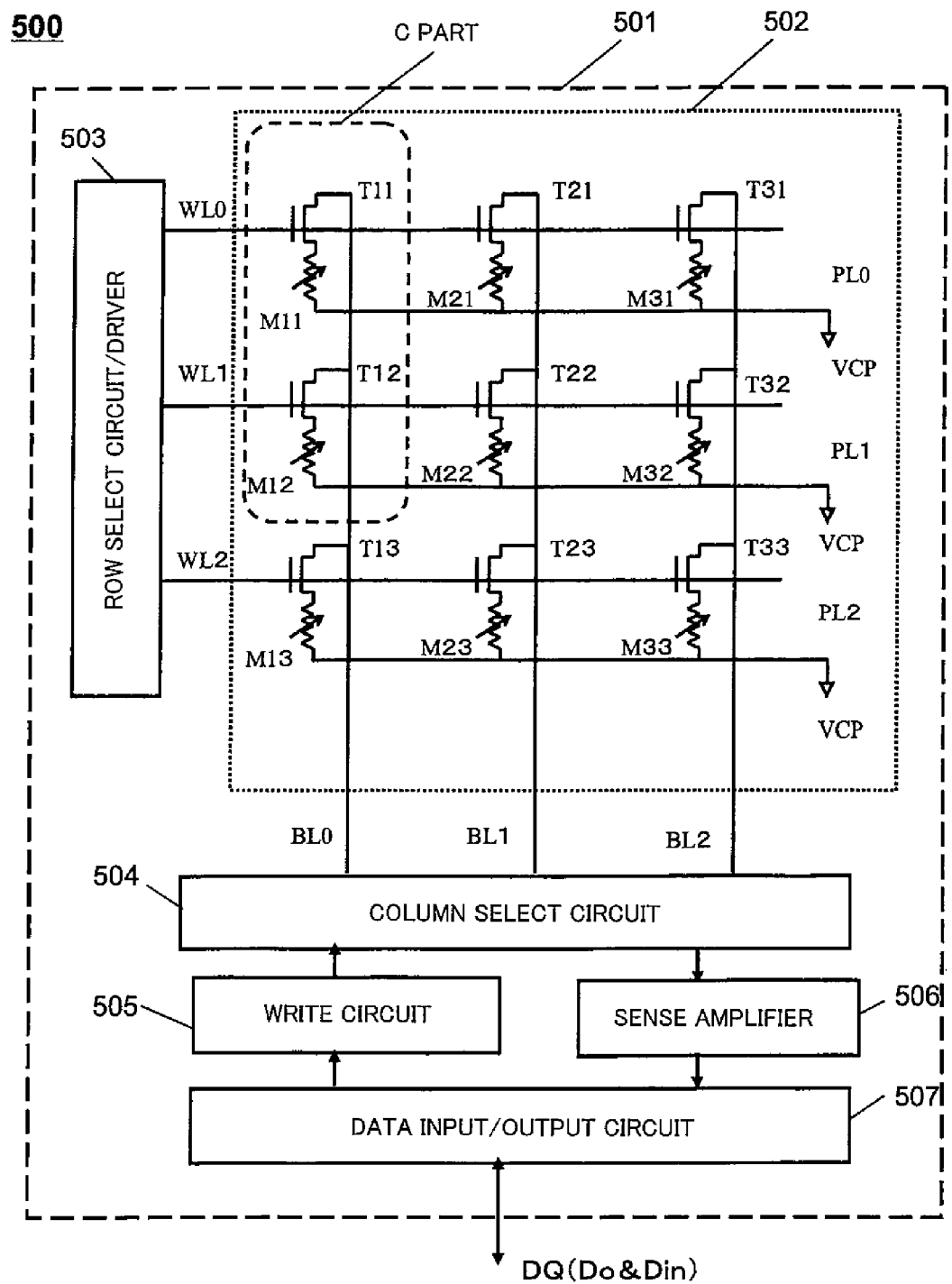
FIG. 13 is a block diagram showing a configuration of a nonvolatile semiconductor device according to Embodiment 5 of the present invention.
Figure 14:
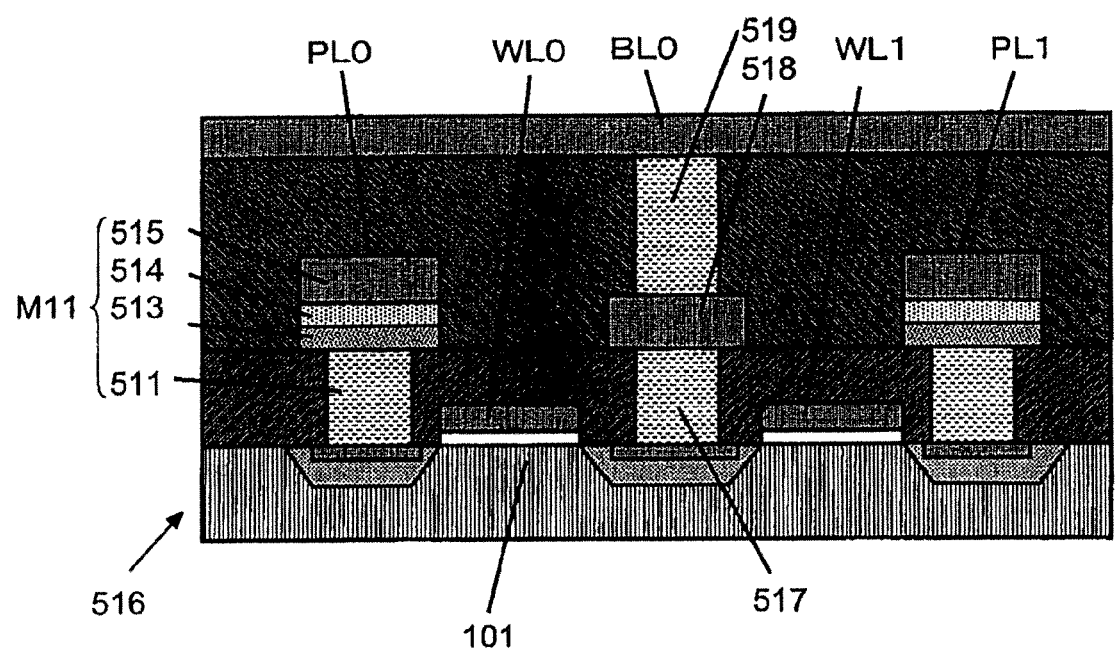
FIG. 14 is an enlarged cross-sectional view showing a configuration of part C of FIG. 13.

FIG. 13 is a block diagram showing a configuration of a nonvolatile semiconductor device 500 according to Embodiment 5 of the present invention. FIG. 14 is an enlarged cross-sectional view showing a configuration (configuration corresponding to 2 bits) in part C of FIG. 13.

The nonvolatile semiconductor device 500 of Embodiment 5 is a nonvolatile semiconductor device 500 including, for example, the nonvolatile semiconductor memory device 100 of Embodiment 1, which includes a memory array including a plurality of word lines formed in, for example, a stripe shape on a substrate to extend in parallel with each other, a plurality of bit lines formed in a stripe shape in the same manner above the plurality of word lines within a plane parallel to a main surface of the substrate such that the plurality of bit lines three-dimensionally cross the word lines, and resistance variable elements provided to respectively correspond to three-dimensional cross-points of the plurality of word lines and the plurality of bit lines.

As shown in FIG. 13, the nonvolatile semiconductor device 500 according to Embodiment 5 includes a memory main section 501 on a semiconductor substrate. The memory main section 501 includes a memory array 502, a row select circuit/driver 503, a column select circuit 504, a write circuit 505 for writing data, a sense amplifier 506 which detects an amount of a current flowing through a selected bit line and determines the data, and a data input/output circuit 507 which executes input/output processing of input/output data via a terminal DQ.

The memory array 502 includes a plurality of word lines WL0, WL1, WL2 and a plurality of bit lines BL0, BL1, BL2 which are formed on the substrate such that the plurality of word lines WL0, WL1, WL2 cross the plurality of bit lines BL0, BL1, BL2, a plurality of transistors T11, T12, T13, T21, T22, T23, T31, T32, T33 (hereinafter expressed as "transistors T11, T12, . . . ") provided to respectively correspond to cross-points of the plurality of word lines WL0, WL1, WL2 and the plurality of bit lines BL0, BL1, BL2 and a plurality of resistance variable elements M11, M12, M13, M21, M22, M23, M31, M32, M33 (hereinafter referred to as "resistance variable elements M11, M12, . . . ") provided to have a one-to-one relationship with the transistors T11, T12, . . . .

The memory array 502 further includes a plurality of plate lines PL0, PL1, and PL2 arranged to extend in parallel with the word lines WL0, WL1, and WL2.

As shown in FIG. 13, the bit line BL0 is provided above the word lines WL0 and WL1, the plate lines PL0 and PL1 are provided between the word lines WL0 and WL1 and the bit line BL0.

The resistance variable element M11 of FIG. 13 corresponds to the resistance variable element M11 of FIG. 14. The resistance variable element M11 includes the first wire 515 which is the upper electrode, the electrode layer 514 comprising precious metal, platinum, the resistance variable layer 513 and the first contact plug 511 which is the lower electrode.

As shown in FIG. 14, each of the memory cell 516 includes the transistor 101 and the resistance variable element M11. The transistor 101 is electrically connected to the bit line BL0 via a second contact plug 517, a second wire 518 and a third contact plug 519.

Next, an operation will be described. Address signals are received from an external circuit (not shown), and row address signals and column address signals are output to the row select circuit/driver 503 and output to the column select circuit 504, respectively, based on the address signals. The address signals are signals indicating the address of a specified memory cell 516 to be selected from among memory cells 516 including the plurality of resistance variable elements M11, M12, . . . . The row address signals are signals indicating a row address in the address indicated by the address signals, and the column address signals are signals indicating a column address in the address indicated by the address signals.

In a write cycle of data, in accordance with a control signal (not shown) externally input, write signals for causing application of write voltages, are output to the write circuit 505, according to the input data Din input to the data input/output circuit 507. In a read cycle of data, in accordance with a control signal, read signal for causing application of read voltages is output to the column select circuit 504.

The row select circuit/driver 503 receives the row address signals output from the address signals, select one from among the plurality of word lines WL0, WL1, WL2 based on the row address signals and applies a predetermined voltage to the selected word line.

The column select circuit/driver 504 receives column address signals output from the address signals, selects one from among the plurality of bit lines BL0, BL1, BL2 based on the column address signals and applies the write voltage or the read voltage to the selected bit line.

When the control signal is a write signal, the write circuit 505 outputs to the column select circuit 504 a signal for causing application of a write voltage to the selected bit line.

In the a read cycle of data, the sense amplifier 506 detects an amount of a current flowing through the selected bit line which is a read target, and determines the data as "1" or "0." The resulting output data DO is output to the external circuit via the data input/output circuit 507.

Although Embodiment 5 has been described using the nonvolatile semiconductor memory device 100 of Embodiment 1, any one of the nonvolatile semiconductor memory devices 200, 300 and 400 of Embodiment 2 to Embodiment 4 may be used.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile semiconductor memory device of the present invention is highly integrated, achieves lower electric power consumption and a high-speed operation, and has a stable write and read characteristic. The nonvolatile semiconductor memory device is useful as a nonvolatile semiconductor memory device for use with various electronic hardwares such as digital home appliance, memory cards, cellular phones, and personal computers.

The invention claimed is:

1. A nonvolatile semiconductor memory device comprising:
   a substrate provided with a plurality of transistors including first main electrodes, second main electrodes, and control electrodes;
   a first interlayer insulating layer formed over the substrate to cover the plurality of transistors;
   a plurality of first contact plugs formed to penetrate the first interlayer insulating layer and to be electrically connected to the first main electrodes of the plurality of transistors, respectively;
   a plurality of resistance variable layers formed to respectively correspond to the plurality of first contact plugs with a one-to-one relationship with the plurality of first contact plugs and to cover at least portions of upper end surfaces of the plurality of first contact plugs, respectively; and
   a first wire formed on the plurality of resistance variable layers to extend in a first direction;
   wherein when the first direction is a forward and rearward direction, and a direction which is perpendicular to the first direction and parallel to a main surface of the substrate is a rightward and leftward direction, an end surface of each of the resistance variable layers in the forward and rearward direction is not coplanar with an end surface of the first wire, a left end surface of the first wire is coplanar with a left end surface of each of the resistance variable layers, and a right end surface of the first wire is coplanar with a right end surface of each of the resistance variable layers.

2. The nonvolatile semiconductor memory device according to claim 1, further comprising a plurality of electrode layers comprising precious metal, and the plurality of electrode layers being disposed between the first wire and the resistance variable layer, respectively.

3. The nonvolatile semiconductor memory device according to claim 2, wherein the precious metal comprises platinum.

4. A nonvolatile semiconductor memory device comprising:
   a substrate provided with a transistor;
   a first interlayer insulating layer formed over the substrate to cover the transistor;
   a first contact plug formed in the first interlayer insulating layer and electrically connected to either a drain electrode or a source electrode of the transistor, and a second contact plug formed in the first interlayer insulating layer and electrically connected to the other of the drain electrode or the source electrode of the transistor;
   a first wire formed to cover at least a portion of the first contact plug;
   a first resistance variable layer formed on the first wire having an end surface which is coplanar with an end surface of the first wire;
   a second wire formed to cover at least a portion of the second contact plug;
   a second resistance variable layer formed on the second wire and having an end surface which is coplanar with an end surface of the second wire;
   a second interlayer insulating layer formed over the first interlayer insulating layer to cover the first wire, the second wire, the first resistance variable layer and the second resistance variable layer;
   a third contact plug formed on the first resistance variable layer to penetrate the second interlayer insulating layer;
   a fourth contact plug formed on the second wire to penetrate the second interlayer insulating layer and the second resistance variable layer; and
   a third wire and a fourth wires which are formed on the second interlayer insulating layer such that the third wire covers the third contact plug, and the fourth wire covers the fourth contact plug.

5. The nonvolatile semiconductor memory device according to claim 1, wherein the resistance variable layer comprises a material including at least tantalum oxide.

6. A method of manufacturing a nonvolatile semiconductor memory device comprising the steps of:
   forming a first interlayer insulating layer over a substrate provided with a transistor such that the first interlayer insulating layer covers the transistor;
   forming a first contact hole on either a drain electrode or a source electrode of the transistor and a second contact hole on the other of the drain electrode or the source electrode of the transistor such that the first contact hole and the second contact hole penetrate the first interlayer insulating layer, and forming a first contact plug into the first contact hole and a second contact plug into the second contact hole;

forming a resistance variable layer such that the resistance variable layer covers at least a portion of the first contact plug; and patterning the resistance variable layer by a photo etching process and forming a first wire and a second wire such that the first wire covers a portion of the resistance variable layer and the second wire covers a portion of the second contact plug, wherein in the patterning of the resistance variable layer, the first wire is used as a mask.

7. A method of manufacturing a nonvolatile semiconductor memory device comprising the steps of:

forming a first interlayer insulating layer over a substrate provided with a transistor such that the first interlayer insulating layer covers the transistor;

forming a first contact hole on either a drain electrode or a source electrode of the transistor and second contact hole on the other of the drain electrode or the source electrode of the transistor such that the first contact hole and the second contact hole penetrate the first interlayer insulating layer, and forming a first contact plug into the first contact hole and second contact plug into the second contact hole;

forming a first wire layer and first resistance variable layer by a first photo etching process such that the first wire layer and the first resistance variable layer cover a portion of the first contact plug and the first resistance variable layer has an end surface coplanar with an end surface of the first wire layer, and forming a second wire layer and a second resistance variable layer by a second photo etching process such that the second wire layer and the second resistance variable layer cover a portion of the second contact plug and the second resistance variable layer has an end surface coplanar with an end surface of the second wire layer;

forming a second interlayer insulating layer over the first interlayer insulating layer such that the second interlayer insulating layer covers the first wire, the first resistance variable layer, the second wire and the second resistance variable layer;

forming a third contact plug on the first resistance variable layer such that the third contact plug penetrates the second interlayer insulating layer;

forming a fourth contact plug on the second wire, such that the fourth contact plug penetrates the second interlayer insulating layer and the second resistance variable layer; and forming a third wire and a fourth wire on the second interlayer insulating layer such that the third wire covers the third contact plug and the fourth wire covers the fourth contact plug.

8. The nonvolatile semiconductor memory device according to claim 2, wherein the resistance variable layer comprises a material including at least tantalum oxide.

9. The nonvolatile semiconductor memory device according to claim 3, wherein the resistance variable layer comprises a material including at least tantalum oxide.

10. The nonvolatile semiconductor memory device according to claim 4, wherein the resistance variable layer comprises a material including at least tantalum oxide.

11. The nonvolatile semiconductor memory device according to claim 1, wherein the first wire covers opposing first and second side faces of the resistance variable layers and does not cover the other opposing third and fourth side faces of the resistance variable layers.

12. The nonvolatile semiconductor memory device according to claim 1, wherein the resistance variable layers are formed in contact with a surface of the first interlayer insulating layer and the first contact plug, respectively.

* * * * *